(12) United States Patent
Shi et al.

(10) Patent No.: US 12,731,957 B2
(45) **Date of Patent: *Sep. 8, 2026**

(54) OPTICAL ELEMENT, OPTICAL ELEMENT MONITORING SYSTEM AND METHOD, ACTIVE LIGHT EMITTING MODULE, AND TERMINAL

(71) Applicant: Huawei Technologies Co., Ltd., Shenzhen (CN)

(72) Inventors: Bin Shi, Shenzhen (CN); Wei Tang, Shanghai (CN); Xiaogang Song, Shenzhen (CN); Bing Yang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/244,770

(22) Filed: Jun. 20, 2025

(65) Prior Publication Data

US 2025/0379418 A1 Dec. 11, 2025

Related U.S. Application Data

(63) Continuation of application No. 17/285,193, filed as application No. PCT/CN2019/110831 on Oct. 12, 2019, now Pat. No. 12,362,535.

(30) Foreign Application Priority Data

Oct. 15, 2018 (CN) ........................ 201811198406.X

(51) Int. Cl.

| | |
|---|---|
| ***H01S 5/02257*** | (2021.01) |
| ***G01S 7/481*** | (2006.01) |
| ***G01S 7/484*** | (2006.01) |
| ***G01S 7/497*** | (2006.01) |
| ***G01S 17/42*** | (2006.01) |

(Continued)

(52) U.S. Cl.

CPC .......... *H01S 5/0261* (2013.01); *G01S 7/4814* (2013.01); *G01S 7/484* (2013.01); *G01S 7/497* (2013.01); *G01S 17/42* (2013.01); *H01S 5/0225* (2021.01); *H01S 5/02257* (2021.01); *H01S 5/06825* (2013.01); *G06V 40/166* (2022.01);

(Continued)

(58) Field of Classification Search

CPC ............... H01S 5/06825; H01S 5/0225; H01S 5/02253; H01S 5/02257

See application file for complete search history.

(56) References Cited

U.S. PATENT DOCUMENTS 8,334,151 B2 * 12/2012 Murai .................... H10H 20/82 438/455
9,711,949 B1 * 7/2017 Raring .................. H01S 5/0425

(Continued)

FOREIGN PATENT DOCUMENTS

CN 106164567 A 11/2016
CN 106249503 A 12/2016

(Continued)

*Primary Examiner* — Tod T Van Roy

(74) *Attorney, Agent, or Firm* — Conley Rose, P.C.

(57) ABSTRACT

An optical element, an optical element monitoring system, and a method monitor in real time whether an optical element such as a diffractive optical element or a diffuser in an active light emitting module is damaged or falls off, and turn off a laser when the optical element is damaged or falls off.

19 Claims, 11 Drawing Sheets

(51) Int. Cl.

| | |
|---|---|
| ***H01S 5/0225*** | (2021.01) |
| ***H01S 5/026*** | (2006.01) |
| ***H01S 5/068*** | (2006.01) |
| *G06V 40/16* | (2022.01) |
| *G06V 40/19* | (2022.01) |
| *H01S 5/02212* | (2021.01) |
| *H01S 5/02253* | (2021.01) |

(52) U.S. Cl.
CPC .......... *G06V 40/19* (2022.01); *H01S 5/02212* (2013.01); *H01S 5/02253* (2021.01)

(56) References Cited

U.S. PATENT DOCUMENTS

| | | | | |
|---|---|---|---|---|
| 10,170,667 | B2* | 1/2019 | Tange | H10H 20/825 |
| 10,290,993 | B2* | 5/2019 | Chen | H01S 5/02253 |
| 10,302,585 | B2 | 5/2019 | Noble et al. | |
| 10,667,341 | B1* | 5/2020 | Kriman | G02B 27/4233 |
| 10,724,705 | B2* | 7/2020 | Yamaguchi | F21S 41/16 |
| 10,801,685 | B2* | 10/2020 | Yamaguchi | B60Q 11/005 |
| 10,818,829 | B2* | 10/2020 | Jin | H10H 20/855 |
| 10,876,705 | B2* | 12/2020 | Suzuki | H01S 5/06825 |
| 10,978,852 | B2* | 4/2021 | Kitajima | H01S 5/06825 |
| 11,056,855 | B2* | 7/2021 | Lee | H01S 5/06804 |
| 11,108,210 | B2* | 8/2021 | Miyoshi | H01S 5/06825 |
| 11,189,753 | B2* | 11/2021 | Lerman | F21K 9/20 |
| 11,196,231 | B2* | 12/2021 | Lell | H01S 5/22 |
| 11,867,651 | B2* | 1/2024 | Grossmann | H01S 5/06825 |
| 12,362,535 | B2* | 7/2025 | Shi | G01S 7/497 |
| 2005/0024293 | A1 | 2/2005 | Sakata et al. | |
| 2006/0273898 | A1* | 12/2006 | Hagiwara | G08B 13/04 340/545.4 |
| 2014/0009952 | A1* | 1/2014 | Nomura | H01S 5/0087 362/509 |
| 2015/0051498 | A1 | 2/2015 | Darty | |
| 2015/0085262 | A1* | 3/2015 | Ogura | F21V 9/40 362/326 |
| 2016/0109110 | A1 | 4/2016 | De Jong et al. | |
| 2016/0290856 | A1* | 10/2016 | Fiederling | F21S 45/70 |
| 2016/0356484 | A1 | 12/2016 | Sawyer et al. | |
| 2017/0199144 | A1* | 7/2017 | Noble | B29D 11/00807 |
| 2017/0310082 | A1 | 10/2017 | Yu et al. | |
| 2017/0353004 | A1* | 12/2017 | Chen | H01S 5/02253 |
| 2018/0119897 | A1* | 5/2018 | Vogt | H01S 5/0087 |
| 2019/0199052 | A1* | 6/2019 | Miyoshi | H01S 5/02257 |
| 2019/0237935 | A1* | 8/2019 | Schrama | H01S 5/4018 |
| 2019/0278104 | A1* | 9/2019 | Chen | G02C 7/02 |
| 2019/0379173 | A1* | 12/2019 | Coffy | H01S 3/034 |
| 2019/0390838 | A1* | 12/2019 | Yamaguchi | F21S 41/16 |
| 2021/0273401 | A1* | 9/2021 | Balimann | H01S 5/0236 |
| 2021/0384703 | A1* | 12/2021 | Watkins | H05B 47/105 |
| 2021/0399517 | A1* | 12/2021 | Shi | G01S 7/497 |
| 2022/0029381 | A1* | 1/2022 | Ripoll | F21V 25/02 |
| 2024/0097402 | A1* | 3/2024 | Iwahama | B41F 15/0881 |
| 2024/0128713 | A1* | 4/2024 | Yang | H01S 5/042 |
| 2024/0258184 | A1* | 8/2024 | Lopez | H01S 5/02218 |

FOREIGN PATENT DOCUMENTS

| | | | |
|---|---|---|---|
| CN | 106949913 | A | 7/2017 |
| CN | 206400202 | U | 8/2017 |
| CN | 107255768 | A | 10/2017 |
| CN | 107608167 | A | 1/2018 |
| CN | 107636508 | A | 1/2018 |
| CN | 107860558 | A | 3/2018 |
| CN | 107870186 | A | 4/2018 |
| CN | 107870273 | A | 4/2018 |
| CN | 107991836 | A | 5/2018 |
| CN | 108121133 | A | 6/2018 |
| CN | 108319034 | A | 7/2018 |
| CN | 108344378 | A | 7/2018 |
| CN | 108387365 | A | 8/2018 |
| CN | 108388064 | A | 8/2018 |
| CN | 108445644 | A | 8/2018 |
| CN | 108548498 | A | 9/2018 |
| CN | 108598849 | A | 9/2018 |
| CN | 109543515 | A | 3/2019 |
| EP | 3848850 | A | 7/2021 |
| JP | 2003156643 | A | 5/2003 |
| JP | 2006258746 | A | 9/2006 |
| JP | 2010287126 | A | 12/2010 |
| RU | 2616653 | C2 | 4/2017 |
| WO | 2016095704 | A1 | 6/2016 |

* cited by examiner

FIG. 2
AA
China Mobile 4G
08:08
11:11
Wednesday, October 29
Weather
Browser
Players
Camera
100
sms
Phone
Contacts
Messages
Gallery

Start

Monitor a voltage value at two ends of a detection line in real time

S11

S1

Convert the voltage value into a resistance value

S12

No

Determine whether the resistance value exceeds a specified resistance threshold range Yes

S2

Control a power supply to stop supplying power to a laser

OPTICAL ELEMENT, OPTICAL ELEMENT MONITORING SYSTEM AND METHOD, ACTIVE LIGHT EMITTING MODULE, AND TERMINAL

CROSS-REFERENCE TO RELATED APPLICATIONS

This is a continuation of U.S. patent application Ser. No. 17/285,193, filed on Apr. 14, 2021, now U.S. Pat. No. 12,362,535, which is a National Stage of International Patent Application No. PCT/CN2019/110831, filed on Oct. 12, 2019, which claims priority to Chinese Patent Application No. 201811198406.X, filed on Oct. 15, 2018. All of the aforementioned applications are hereby incorporated by reference in their entireties.

TECHNICAL FIELD

The present invention relates to the field of electronic terminal device technologies, and in particular, to an optical element, an optical element monitoring system and method, an active light emitting module, and a terminal.

BACKGROUND

Currently, a 3D sensing technology is a research hotspot in an electronic terminal device (for example, a mobile phone) field. The 3D sensing technology is a deep sensing technology, may be used to further improve a facial recognition or iris recognition function and enhance a facial and object recognition function of a terminal camera, and is applicable to functions such as augmented reality, a game, and self-driving.

Active light emitting modules such as structured light and a TOF (Time Of Flight, time of flight) are integrated into the terminal to implement a 3D sensing function. This type of active light emitting module usually includes a high-power laser. The laser actively emits light and projects the light onto a human face to implement facial recognition. Because the laser emits laser light, an optical element, configured to disperse light or diffuse light, such as a diffractive optical element (Diffractive Optical Element, DOE for short) or a diffuser (Diffuser) is disposed at a light emission direction of the laser, to avoid injuries to a human eye caused by laser light.

However, if the optical element such as the diffractive optical element or the diffuser is damaged or falls off, the laser light emitted by the high-power laser may leak out.

SUMMARY

The present invention provides an optical element, an optical element monitoring system and method, an active light emitting module, and a terminal, to monitor in real time an abnormal state in which an optical element such as a diffractive optical element or a diffuser in an active light emitting module is damaged or falls off, and turn off a laser when the optical element is damaged or falls off, thereby avoiding laser light leakage.

To achieve the foregoing objective, the following technical solutions are used in the present invention.

A first aspect of the present invention provides an optical element, including a substrate and a detection line disposed on a surface on one side of the substrate. The detection line is configured to transmit an electrical signal.

In this way, the optical element is applied to an active light emitting module, two ends of the detection line are connected to a microprocessor of the active light emitting module by using conducting wires, and the microprocessor is used to monitor a resistance value of the detection line or a voltage value at the two ends of the detection line in real time. When the resistance value of the detection line or the voltage value at the two ends of the detection line changes abnormally, it indicates that the detection line is broken, or a joint between the detection line and the conducting wire is open-circuited. Therefore, it may be determined that the optical element to which the detection line is attached is damaged or falls off. In this case, the microprocessor is used to control a laser of the active light emitting module to be turned off, to effectively avoid injuries to a human eye caused by laser light emitted by the laser when the optical element is damaged or falls off. In addition, in this solution, only one optical element and detection line need to be disposed (that is, only one conductive layer is required). Therefore, a structure is simple, a manufacturing process is simple, and costs are relatively low.

With reference to the first aspect, in a possible design, a material of the detection line is a transparent conductive material, to avoid shielding light emitted by the laser.

Optionally, the material of the detection line includes any one or more of indium tin oxide, indium zinc oxide, indium gallium zinc oxide, indium tin zinc oxide, and the like.

With reference to the first aspect, in a possible design, the surface that is of the substrate and on which the detection line is located is equally divided into a plurality of regions, and each of the regions is covered by at least one segment of the detection line. In this way, the detection line covers all regions of the optical element as much as possible, to ensure that damage in each region or even all the regions of the optical element can be monitored, thereby improving monitoring accuracy.

Optionally, coverage areas of the detection line in the regions are the same. Optionally, widths of the detection line in the regions are the same. Optionally, gaps between adjacent parts of the detection line are the same. In this way, monitoring accuracy and sensitivity can be further improved.

With reference to the first aspect, in a possible design, the detection line extends in a fold line shape or a spiral line shape, so that the detection line covers all regions of the optical element as much as possible.

With reference to the first aspect, in a possible design, the optical element further includes a conductive pad disposed on a surface on a same side of the substrate as a side on which the detection line is located, and the conductive pad is located at an end part of the detection line and is electrically connected to the end part of the detection line. In this way, the conducting wire may be electrically connected to the detection line by using the conductive pad.

Optionally, a material of the conductive pad is the same as a material of the detection line, so that the conductive pad and the detection line are formed simultaneously in a same step, thereby simplifying a preparation step.

Optionally, the optical element further includes a protective layer covering the detection line, and an opening is disposed at the protective layer to expose the conductive pad. In this way, the protective layer can protect the detection line, and the disposed opening can facilitate an electrical connection between the end part of the detection line or the conductive pad and the conducting wire.

A second aspect of the present invention provides an active light emitting module. The active light emitting module includes a module housing, a laser, a microprocessor, an optical element, and conducting wires. The module housing includes a bottom substrate and a side wall. The laser and the microprocessor are mounted on the bottom substrate. The optical element is mounted at one end that is of the side wall and that is away from the bottom substrate, and the optical element is any one of the foregoing optical elements. The conducting wires are configured to connect two ends of a detection line of the optical element to the microprocessor. The microprocessor is configured to: monitor a resistance value of the detection line or a voltage value at the two ends of the detection line in real time, determine, based on the monitored resistance value or voltage value, whether the optical element is damaged or falls off, and control, when determining that the optical element is damaged or falls off, the laser to be turned off, to effectively avoid injuries to a human eye caused by laser light emitted by the laser when the optical element is damaged or falls off.

With reference to the second aspect, in a possible design, the conducting wire extends from an end part of the detection line to the microprocessor inside the side wall. Alternatively, the conducting wire extends from an end part of the detection line to the microprocessor on an inner surface of the side wall. Alternatively, the conducting wire extends from an end part of the detection line to the microprocessor on an outer surface of the side wall. In this way, the detection line is connected to the microprocessor.

With reference to the second aspect, in a possible design, the active light emitting module further includes a conductive electrode disposed at a joint between an end part of the detection line and the conducting wire, and the conductive electrode is configured to electrically connect the end part of the detection line to the conducting wire, so that the detection line is electrically connected to the conducting wire.

Optionally, a material of the conductive electrode is conductive silver paste or soldering tin. Therefore, a manufacturing process is simple and is easily implemented.

A third aspect of the present invention provides a terminal. The terminal includes any one of the foregoing active light emitting modules. The active light emitting module can generate a same beneficial effect as the active light emitting module provided in the second aspect of the present invention. Details are not described herein again.

A fourth aspect of the present invention provides an optical element monitoring system. The optical element monitoring system includes a microprocessor, a power supply, and a laser that are sequentially connected. The optical element monitoring system further includes any one of the foregoing optical elements, and two ends of a detection line of the optical element are connected to the microprocessor. The microprocessor is configured to: monitor a resistance value of the detection line or a voltage value at the two ends of the detection line in real time, determine, based on the monitored resistance value or voltage value, whether the optical element is damaged or falls off, and control, when determining that the optical element is damaged or falls off, the power supply to stop supplying power to the laser, and therefore the laser is turned off, to effectively avoid injuries to a human eye caused by laser light emitted by the laser when the optical element is damaged or falls off.

A fifth aspect of the present invention provides an optical element monitoring method. The optical element monitoring method is applied to the foregoing optical element monitoring system, and the optical element monitoring method includes the following steps: A microprocessor monitors a resistance value of a detection line in real time. The microprocessor determines whether the monitored resistance value exceeds a specified resistance threshold range, and if the monitored resistance value exceeds the specified resistance threshold range, the microprocessor controls a power supply to stop supplying power to a laser; or if the monitored resistance value does not exceed the specified resistance threshold range, the microprocessor monitors a resistance value of the detection line at a next moment. The specified resistance threshold range is a numerical range that fluctuates up and down around the resistance value when the detection line is not broken. According to the optical element monitoring method, an abnormal state in which an optical element in an active light emitting module is damaged or falls off is monitored in real time, and the laser may be turned off when the optical element is damaged or falls off, to avoid laser light leakage.

With reference to the fifth aspect, in a possible design, that a microprocessor monitors a resistance value at two ends of a detection line in real time includes the following steps: The microprocessor monitors a voltage value at the two ends of the detection line in real time. The microprocessor converts the monitored voltage value into the resistance value. In this way, a specific solution for monitoring the resistance value of the detection line in real time is provided.

A sixth aspect of the present invention provides an optical element monitoring method. The optical element monitoring method is applied to the foregoing optical element monitoring system, and the optical element monitoring method includes the following steps: A microprocessor monitors a voltage value at two ends of a detection line in real time. The microprocessor determines whether the monitored voltage value exceeds a specified voltage threshold range, and if the monitored voltage value exceeds the specified voltage threshold range, the microprocessor controls a power supply to stop supplying power to a laser; or if the monitored voltage value does not exceed the specified voltage threshold range, the microprocessor monitors a voltage value at the two ends of the detection line at a next moment. The specified voltage threshold range is a numerical range that fluctuates up and down around the voltage value at the two ends of the detection line when the detection line is not broken. According to the optical element monitoring method, an abnormal state in which an optical element in an active light emitting module is damaged or falls off is monitored in real time, and the laser may be turned off when the optical element is damaged or falls off, to avoid laser light leakage.

DESCRIPTION OF EMBODIMENTS

The following terms "first" and "second" are merely intended for a purpose of description, and shall not be understood as an indication or implication of relative importance or implicit indication of a quantity of indicated technical features. Therefore, a feature limited by "first" or "second" may explicitly or implicitly include one or more features. In the descriptions of the embodiments of the present invention, unless stated otherwise, "a plurality of" means two or more than two.

Embodiments of the present invention provide an optical element monitoring system and monitoring method. The optical element monitoring system and monitoring method may be applied to any terminal such as a mobile phone, a wearable device, an AR (augmented reality)/VR (virtual reality) device, a tablet computer, a notebook computer, a UMPC (ultra-mobile personal computer), a netbook, or a PDA (personal digital assistant). This is not limited in the embodiments of the present invention.

Figure 1:
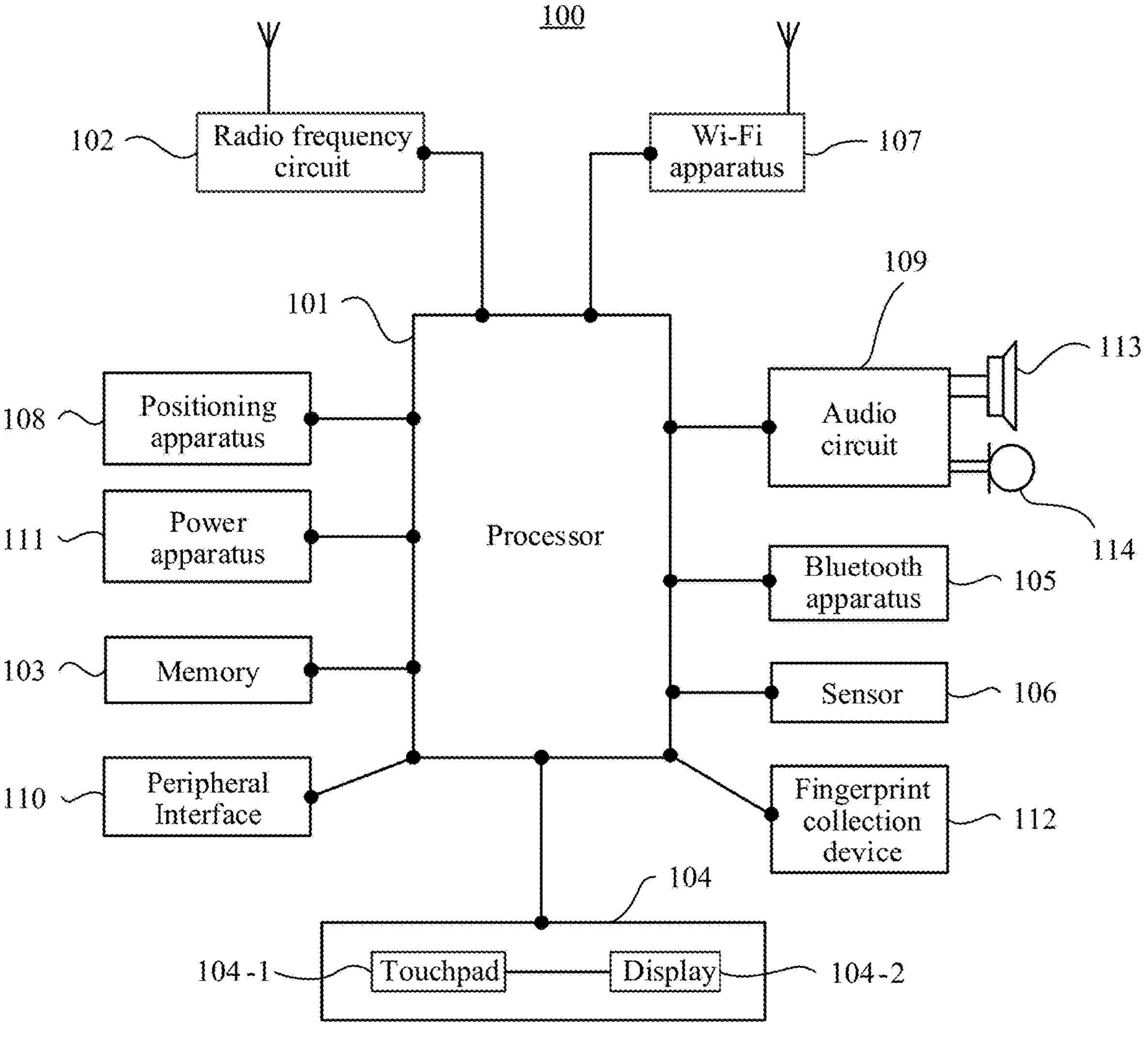
FIG. 1 is a schematic structural diagram of a terminal according to an embodiment of the present invention.
Figure 2:
FIG. 2 is a schematic diagram of an application scenario of an optical element monitoring system according to an embodiment of the present invention.

As shown in FIG. 1 and FIG. 2, the terminal in the embodiments of the present invention may be a mobile phone 100. The mobile phone 100 is used as an example below to describe the embodiments in detail.

As shown in FIG. 1, the mobile phone 100 may specifically include components such as a processor 101, a radio frequency (RF) circuit 102, a memory 103, a touchscreen 104, a Bluetooth apparatus 105, one or more sensors 106, a Wi-Fi apparatus 107, a positioning apparatus 108, an audio circuit 109, a peripheral interface 110, and a power apparatus 111. These components may perform communication by using one or more communications buses or signal cables (not shown in FIG. 2). A person skilled in the art may understand that a hardware structure shown in FIG. 2 does not constitute a limitation on the mobile phone, and the mobile phone 100 may include more or fewer components than those shown in the figure, or may combine some components, or may have different component arrangements.

The following describes in detail the components of the mobile phone 100 with reference to FIG. 1.

The processor 101 is a control center of the mobile phone 100. The processor 101 is connected to all parts of the mobile phone 100 by using various interfaces and lines, and performs various functions of the mobile phone 100 and data processing by running or executing an application (which is briefly referred to as app) stored in the memory 103 and invoking data stored in the memory 103. In some embodiments, the processor 101 may include one or more processing units. For example, the processor 101 may be a Kirin 960 chip manufactured by Huawei Technologies Co., Ltd.

The radio frequency circuit 102 may be configured to: receive and send a radio signal in an information receiving/sending process or a call process. Specifically, the radio frequency circuit 102 may receive downlink data from a base station, and then send the downlink data to the processor 101 for processing. In addition, the radio frequency circuit 102 sends related uplink data to the base station. Usually, the radio frequency circuit includes but is not limited to an antenna, at least one amplifier, a transceiver, a coupler, a low noise amplifier, a duplexer, and the like. In addition, the radio frequency circuit 102 may further communicate with another device through wireless communication. The wireless communication may use any communications standard or protocol, including but not limited to a global system for mobile communications, a general packet radio service, code division multiple access, wideband code division multiple access, long term evolution, an email, a short message service, and the like.

The memory 103 is configured to store the application and the data. The processor 101 performs the various functions of the mobile phone 100 and the data processing by running the application and the data that are stored in the memory 103. The memory 103 mainly includes a program storage area and a data storage area. The program storage area may store an operating system and an application required by at least one function (such as a sound playback function or an image playback function). The data storage area may store data (for example, audio data or a phone book) created based on use of the mobile phone 100. In addition, the memory 103 may include a high-speed random access memory, and may further include a non-volatile memory such as a magnetic disk storage device, a flash memory device, or another volatile solid-state storage device. The memory 103 may store various operating systems such as an iOS operating system developed by Apple and an Android operating system developed by Google.

The touchscreen 104 may include a touchpad 104-1 and a display 104-2. The touchpad 104-1 may collect a touch event performed by a user of the mobile phone 100 on or near the touchpad 104-1 (for example, an operation performed by the user on the touchpad 104-1 or near the touchpad 104-1 by using any proper object such as a finger or a stylus), and send collected touch information to another component such as the processor 101.

The touch event performed by the user near the touchpad 104-1 may be referred to as a floating touch. The floating touch may indicate that the user does not need to directly touch the touchpad for selecting, moving, or dragging an object (for example, an icon), and the user only needs to be near the terminal to perform a desired function. In an application scenario of the floating touch, terms such as "touch" and "contact" do not implicitly mean to directly touch the touchscreen, but to be near or close to the touchscreen.

Specifically, two types of capacitance sensors: a mutual-capacitance sensor and a self-capacitance sensor may be disposed in the touchpad 104-1. The two types of capacitance sensors may be arranged on the touchpad 104-1 alternately. The mutual-capacitance sensor is configured to implement a normal conventional multi-point touch, to be specific, detect a gesture generated when the user touches the touchpad 104-1. The self-capacitance sensor can generate a signal stronger than that of the mutual-capacitance sensor, to detect finger induction farther away from the touchpad 104-1. Therefore, when a finger of the user hovers over a screen, because the signal generated by the self-capacitance sensor is stronger than the signal generated by the mutual-capacitance sensor, the mobile phone 100 can detect a gesture of the user above the screen, for example, in a position 20 mm above the touchpad 104-1.

Optionally, the touchpad 104-1 that can support the floating touch may be implemented using capacitive, infrared light sensing, an ultrasonic wave, and other technologies. In addition, the touchpad 104-1 may be implemented using various technologies such as resistive, capacitive, infrared, and surface acoustic wave technologies. The display 104-2 may be configured to display information entered by the user, information provided for the user, and various menus of the mobile phone 100. The display 104-2 may be configured in a form of a liquid crystal display, an organic light emitting diode, or the like. The touchpad 104-1 may cover the display 104-2. After detecting the touch event on or near the touchpad 104-1, the touchpad 104-1 transfers the touch event to the processor 101 to determine a type of the touch event. Then, the processor 101 may provide corresponding visual output on the display 104-2 based on the type of the touch event.

Although in FIG. 1, the touchpad 104-1 and the display 104-2 are used as two independent components to implement input and output functions of the mobile phone 100, in some embodiments, the touchpad 104-1 and the display 104-2 may be integrated to implement the input and output functions of the mobile phone 100.

It may be understood that the touchscreen 104 is formed by stacking layers of materials. In this embodiment of the present invention, only the touchpad (layer) and the display (layer) are displayed, and another layer is not recorded in this embodiment of the present invention. In addition, in some other embodiments of the present invention, the touchpad 104-1 may cover the display 104-2, and a size of the touchpad 104-1 is greater than a size of the display 104-2, so that the display 104-2 is entirely covered by the touchpad 104-1. Alternatively, the touchpad 104-1 may be configured on a front side of the mobile phone 100 in a full panel form, in other words, any touch performed by the user on the front side of the mobile phone 100 can be sensed by the mobile phone. In this way, full touch experience on the front side of the mobile phone can be implemented. In some other embodiments, the touchpad 104-1 is configured on the front side of the mobile phone 100 in a full panel form, and the display 104-2 may also be configured on the front side of the mobile phone 100 in a full panel form. In this way, a bezel-less structure can be implemented on the front side of the mobile phone.

In this embodiment of the present invention, the mobile phone 100 may further have a fingerprint recognition function. For example, a fingerprint collection device 112 may be disposed on a rear side (for example, below a rear-facing camera) of the mobile phone 100, or the fingerprint collection device 112 may be disposed on a front side (for example, below the touchscreen 104) of the mobile phone 100. For another example, a fingerprint collection device 112 may be disposed on the touchscreen 104 to implement the fingerprint recognition function. In other words, the fingerprint collection device 112 may be integrated into the touchscreen 104 to implement the fingerprint recognition function of the mobile phone 100. In this case, the fingerprint collection device 112 is disposed on the touchscreen 104, and may be a part of the touchscreen 104, or may be disposed on the touchscreen 104 in another manner. In addition, the fingerprint collection device 112 may be further implemented as a full-panel fingerprint collection device. Therefore, the touchscreen 104 may be considered as a panel on which fingerprint recognition can be performed at any location. The fingerprint collection device 112 may send a collected fingerprint to the processor 101, so that the processor 101 processes the fingerprint (for example, fingerprint verification). A main component of the fingerprint collection device 112 in this embodiment of the present invention is a fingerprint sensor. The fingerprint sensor may use any type of sensing technology, including but not limited to an optical sensing technology, a capacitive sensing technology, a piezoelectric sensing technology, an ultrasonic sensing technology, or the like.

The mobile phone 100 may further include the Bluetooth apparatus 105, configured to exchange data between the mobile phone 100 and another short-distance terminal (for example, a mobile phone or a smartwatch). The Bluetooth apparatus 105 in this embodiment of the present invention may be an integrated circuit, a Bluetooth chip, or the like.

The mobile phone 100 may further include at least one type of sensor 106, such as a light sensor, a motion sensor, or another sensor. Specifically, the light sensor may include an ambient light sensor and a proximity sensor. The ambient light sensor may adjust luminance of the display of the touchscreen 104 based on intensity of ambient light. The proximity sensor may power off the display when the mobile phone 100 moves to an ear. As a type of the motion sensor, an accelerometer sensor may detect values of acceleration in all directions (usually on three axes), may detect a value and a direction of gravity when the mobile phone is still. The accelerometer sensor may be applied to an application for identifying a mobile phone posture (such as switching between a landscape mode and a portrait mode, a related game, or magnetometer posture calibration), a function related to vibration recognition (such as a pedometer or a knock), or the like. Other sensors such as a gyroscope, a barometer, a hygrometer, a thermometer, and an infrared sensor may be further configured in the mobile phone 100. Details are not described herein.

The Wi-Fi apparatus 107 is configured to provide the mobile phone 100 with network access that complies with a Wi-Fi-related standard protocol. The mobile phone 100 may access a Wi-Fi access point by using the Wi-Fi apparatus 107, to help the user to receive and send an email, browse a web page, access streaming media, and the like. The Wi-Fi apparatus 107 provides the user with wireless broadband internet access. In some other embodiments, the Wi-Fi apparatus 107 may alternatively be used as a Wi-Fi wireless access point, and may provide Wi-Fi network access for another terminal.

The positioning apparatus 108 is configured to provide a geographical location for the mobile phone 100. It may be understood that the positioning apparatus 108 may be specifically a receiver of a positioning system such as a global positioning system (GPS), a BeiDou navigation satellite system, or a Russian GLONASS. After receiving the geographical location sent by the positioning system, the positioning apparatus 108 sends the information to the processor 101 for processing, or sends the information to the memory 103 for storage. In some other embodiments, the positioning apparatus 108 may be further a receiver of an assisted global positioning system (AGPS). The AGPS system serves as an assisted server to assist the positioning apparatus 108 in completing ranging and positioning services. In this case, the assisted positioning server communicates, through a wireless communications network, with the positioning apparatus 108 (namely, a GPS receiver) of the terminal such as the mobile phone 100 and provides positioning assistance. In some other embodiments, the positioning apparatus 108 may alternatively be a positioning technology based on a Wi-Fi access point. Each Wi-Fi access point has a globally unique MAC address, and the terminal can scan and collect a broadcast signal of a surrounding Wi-Fi access point when Wi-Fi is enabled. Therefore, a MAC address that is broadcast by the Wi-Fi access point can be obtained. The terminal sends such data (for example, the MAC address) that can identify the Wi-Fi access point to a location server through the wireless communications network. The location server retrieves a geographical location of each Wi-Fi access point, obtains a geographical location of the terminal through calculation with reference to strength of the Wi-Fi broadcast signal, and sends the geographical location of the terminal to the positioning apparatus 108 of the terminal.

The audio circuit 109, a speaker 113, and a microphone 114 may provide an audio interface between the user and the mobile phone 100. The audio circuit 109 may convert received audio data into an electrical signal and then transmit the electrical signal to the speaker 113. The speaker 113 converts the electrical signal into a sound signal for output. In addition, the microphone 114 converts a collected sound signal into an electrical signal, and the audio circuit 109 receives the electrical signal and converts the electrical signal into audio data, and then outputs the audio data to the RF circuit 102 to send the audio data to, for example, another mobile phone, or outputs the audio data to the memory 103 for further processing.

The peripheral interface 110 is configured to provide various interfaces for an external input/output device (for example, a keyboard, a mouse, an external display, an external memory, or a subscriber identification module card). For example, the peripheral interface 110 is connected to the mouse through a universal serial bus (USB) interface, and the peripheral interface 110 is connected, by using a metal contact on a card slot of the subscriber identification module card, to the subscriber identification module (SIM) card provided by a telecommunications operator. The peripheral interface 110 may be configured to couple the external input/output peripheral device to the processor 101 and the memory 103.

The mobile phone 100 may further include the power apparatus 111 (for example, a battery and a power management chip) that supplies power to the components. The battery may be logically connected to the processor 101 by using the power management chip, to implement functions such as charging management, discharging management, and power consumption management by using the power apparatus 111.

Although not shown in FIG. 1, the mobile phone 100 may further include a camera (a front-facing camera and/or a rear-facing camera), a flash, a micro projection apparatus, a near field communication (NFC) apparatus, and the like. Details are not described herein.

A 3D sensing module may be integrated into the terminal such as the mobile phone 100, so that the terminal implements a 3D sensing function. A common digital camera can obtain only a flat color image without depth information of the image. This means that when seeing a photo, the user knows only a width and a height of a face of a person, but does not know a three-dimensional structure of the face of the person, for example, a height of the nose bridge relative to the cheek, and a depth of the eye socket relative to the cheek. The image depth information is obtained through 3D sensing, so that the terminal can implement facial recognition or gesture control. For example, the mobile phone is unlocked by recognizing a facial feature of the user, or when the user makes a swipe gesture in front of the mobile phone, the terminal may be controlled to delete an email.

The following two technologies are mainly used to implement 3D sensing.

(1) ToF (Time Of Flight, time of flight) technology: A high-power laser, for example, a VCSEL (Vertical Cavity Surface Emitting Laser, single-point vertical cavity surface emitting laser) is used to emit infrared laser light to a surface of an object, the laser light is reflected on the surface of the object, and the reflected laser light is captured by an infrared image sensor. Because a light speed of the laser light is known, the infrared image sensor can be used to measure times of reflecting the laser light at different depth locations on the surface of the object, and obtain distances (depths) of the different locations on the surface of the object through calculation.

(2) Structured light (Structured Light) technology: A laser is used to produce different light patterns (where light with a specific structure feature is referred to as structured light). After being projected onto a surface of an object, the light patterns are reflected at different depth locations on the surface of the object, and the reflected light patterns are distorted. For example, light of a linear stripe that is emitted by the laser is projected onto a finger. Because a surface of the finger is in a three-dimensional arc shape, a stripe reflected by the arc-shaped surface of the finger is an arc-shaped stripe. After the arc-shaped stripe is captured by an infrared image sensor, the terminal may reversely deduce a three-dimensional structure of the finger based on the reflected arc-shaped stripe.

As shown in FIG. 2, in an example of the mobile phone 100, a ToF or structured light 3D sensing module may be disposed at the top of the mobile phone 100, for example, at a "notch" location (namely, a region AA shown in FIG. 2) of the mobile phone 100.

Figure 3:
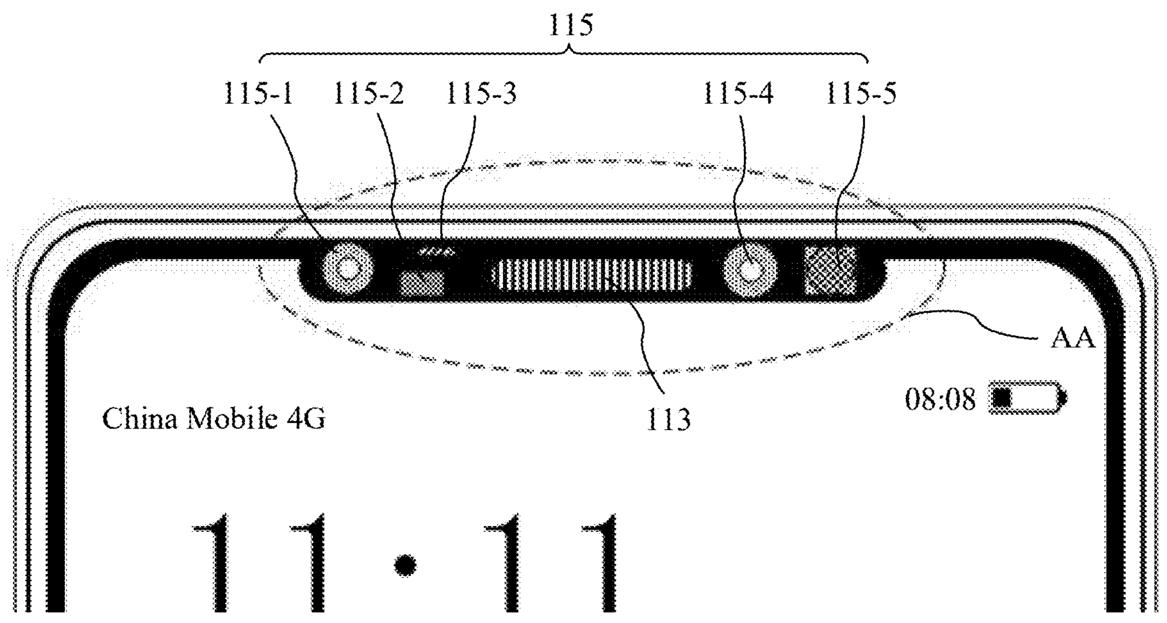
FIG. 3 is a partially enlarged diagram of FIG. 2.

As shown in FIG. 3, for example, a structured light 3D sensing module 115 is integrated into the mobile phone 100. The structured light 3D sensing module 115 is arranged in the mobile phone 100 in the following form. The structured light 3D sensing module 115 includes modules such as an infrared camera 115-1, a flood illuminator 115-2, a short-distance sensor 115-3, an infrared image sensor 115-4, and a dot-matrix projector 115-5. The flood illuminator 115-2 includes a low-power laser (for example, a VCSEL), a diffuser, and the like. The dot-matrix projector 115-5 includes a high-power laser (for example, a VCSEL), a diffractive optical element, and the like.

For example, a process in which the structured light 3D sensing module 115 performs facial recognition is as follows: When an object (for example, a face) approaches the mobile phone 100, the short-distance sensor 115-3 senses that the object approaches the mobile phone 100, so that the short-distance sensor 115-3 sends, to the processor 101 of the mobile phone 100, a signal indicating that the object approaches. The processor 101 receives the signal indicating that the object approaches, and controls the flood illuminator

115-2 to be started, and the low-power laser in the flood illuminator 115-2 projects infrared laser light onto a surface of the object. The infrared laser light projected by the flood illuminator 115-2 is reflected on the surface of the object, and the infrared camera 115-1 captures the infrared laser light reflected by the surface of the object, to obtain image information of the surface of the object, and then uploads the obtained image information to the processor 101. The processor 101 determines, based on the uploaded image information, whether the object approaching the mobile phone 100 is the face.

When determining that the object approaching the mobile phone 100 is the face, the processor 101 controls the dot-matrix projector 115-5 to be started. The high-power laser in the dot-matrix projector 115-5 emits infrared laser light, and a structure such as the diffractive optical element in the dot-matrix projector 115-5 performs an operation on the infrared laser light to form many (for example, approximately 30,000) structured light spots, and projects the structured light spots onto a surface of the face. An array formed by the structured light spots is reflected by different locations on the surface of the face. The infrared camera 115-1 captures the structured light spots reflected by the surface of the face, to obtain depth information of the different locations on the surface of the face, and then uploads the obtained depth information to the processor 101. The processor 101 compares and calculates the uploaded depth information and user's facial feature data pre-stored in the mobile phone 100, and identifies whether the face approaching the mobile phone 100 is the face of the user of the mobile phone 100, and if the face approaching the mobile phone 100 is the face of the user of the mobile phone 100, the processor 101 controls the mobile phone 100 to be unlocked; or if the face approaching the mobile phone 100 is not the face of the user of the mobile phone 100, the processor 101 controls the mobile phone 100 to remain in a locked state.

The ToF or structured light 3D sensing module includes a module that can emit laser light, for example, a module that is in the ToF 3D sensing module and that includes a high-power laser, or the dot-matrix projector 115-5 and the flood illuminator 115-2 that are in the structured light 3D sensing module 115. This type of module is referred to as an active light emitting module below.

Figure 4A:
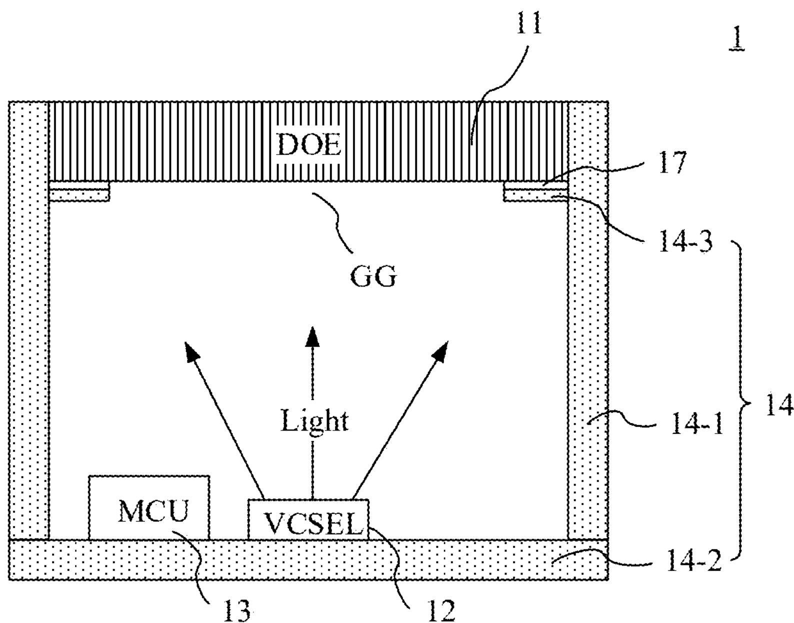
FIG. 4A is a schematic diagram of a typical structure of an active light emitting module.
Figure 4B:
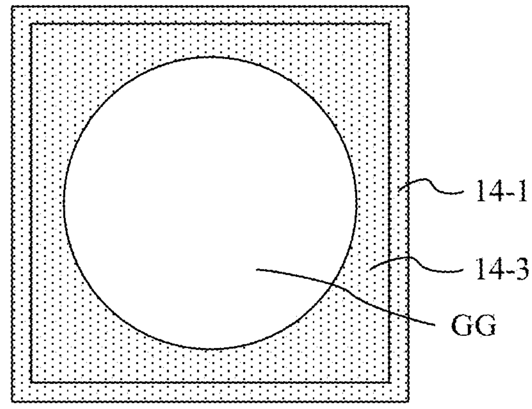
FIG. 4B is a top view of a support structure in an active light emitting module.

FIG. 4A shows a typical structure of an active light emitting module 1. The active light emitting module 1 mainly includes an optical element 11, a laser 12, a microprocessor (MCU, Microcontroller Unit) 13, and a module housing 14. The module housing 14 includes a bottom substrate 14-2, a side wall 14-1, and a support structure 14-3. Referring to FIG. 4B, the support structure 14-3 is in a ring structure, and is disposed around an inner surface of the side wall 14-1, to form an aperture GG. The laser 12 and the microprocessor 13 are mounted on the bottom substrate 14-2. The microprocessor 13 is connected to a processor integrated on a mainboard of the terminal. For example, if the active light emitting module 1 is applied to the mobile phone 100, the microprocessor 13 of the active light emitting module 1 is connected to the processor 101 of the mobile phone 100. An edge of the optical element 11 is fastened to a surface that is of the support structure 14-3 and that is opposite to the laser 12 by using an adhesive 17. The microprocessor 13 is connected to the laser 12, and controls the laser 12 to emit laser light. The laser light is emitted out of the active light emitting module 1 by using the optical element 11 through the aperture GG. When the active light emitting module 1 is mounted in the terminal such as the mobile phone 100, a side (namely, a light emitting side) of the laser 12 in the active light emitting module 1 is close to the inside of the terminal, and a side (namely, a light outgoing side) of the optical element 11 faces the outside of the terminal, to project laser light outward.

In the active light emitting module 1, the laser 12 may be specifically a VCSEL, a DFB (Distributed Feedback Laser, distributed feedback laser), an edge-emitting laser, or the like. The optical element 11 may be specifically a diffuser, a diffractive optical element, a Fresnel lens, or the like. For example, if the active light emitting module 1 is a module that is in the ToF 3D sensing module and that includes the high-power laser, the optical element 11 may be specifically the diffuser. If the active light emitting module 1 is the dot-matrix projector in the structured light 3D sensing module, the optical element 11 may be specifically the diffractive optical element (DOE). If the active light emitting module 1 is the flood illuminator in the structured light 3D sensing module, the optical element 11 may be specifically the diffuser.

In an actual use process of the terminal, as a use time is prolonged, reliability of the active light emitting module 1 in the terminal is reduced due to aging, and the optical element 11 in the active light emitting module 1 may be damaged or fall off due to water penetration, erosion, or the like. In this case, the laser light emitted by the laser 12 in the active light emitting module 1 is directed onto a human eye, and consequently the human eye is damaged. If the laser 12 in the active light emitting module 1 emits high-power laser light, damage to the human eye is more serious.

Figure 5A:
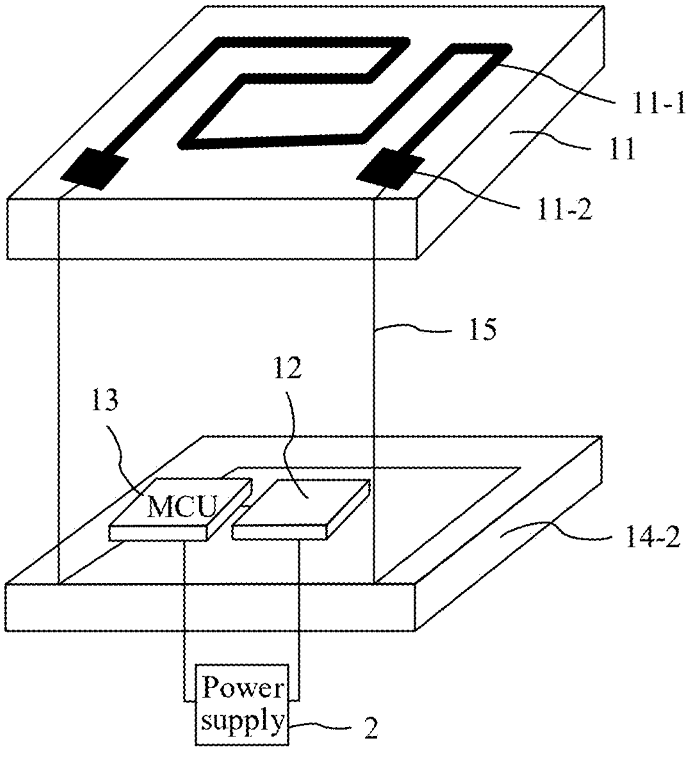
FIG. 5A is an architectural diagram of an optical element monitoring system according to an embodiment of the present invention.
Figure 5B:
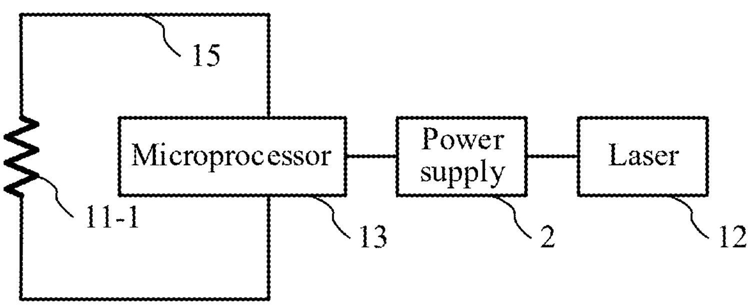
FIG. 5B is a circuit diagram of an optical element monitoring system according to an embodiment of the present invention.

To resolve the foregoing problem, an embodiment of the present invention provides an optical element monitoring system. As shown in FIG. 5A, the optical element monitoring system includes an optical element 11, a laser 12, a microprocessor 13, and a power supply 2. The microprocessor 13, the power supply 2, and the laser 12 are sequentially connected, and the power supply 2 supplies power to the laser 12 under control of the microprocessor 13. It should be noted that in the optical element monitoring system provided in this embodiment of the present invention, the "power supply 2" may be a power supply of a terminal, for example, the power apparatus 111 in the mobile phone 100.

A conductive detection line 11-1 is disposed on a surface of the optical element 11. Two ends of the detection line 11-1 are connected to the microprocessor 13 by using conducting wires 15. The microprocessor 13 monitors a resistance value of the detection line 11-1 or a voltage value at the two ends of the detection line 11-1 in real time. The detection line 11-1, the conducting wire 15, and the microprocessor 13 form a monitoring circuit.

When the resistance value of the detection line 11-1 or the voltage value at the two ends of the detection line 11-1 changes abnormally, for example, the resistance value of the detection line 11-1 exceeds a specified resistance threshold range, or the voltage value at the two ends of the detection line 11-1 exceeds a specified voltage threshold range, it indicates that the monitoring circuit including the detection line 11-1, the conducting wire 15, and the microprocessor 13 is open-circuited, that is, the detection line 11-1 may be broken, or a joint between the detection line 11-1 and the conducting wire 15 is open-circuited. The detection line 11-1 may be broken because the optical element 11 to which the detection line 11-1 is attached is damaged. The joint between the detection line 11-1 and the conducting wire 15 may be open-circuited because the optical element 11 to which the detection line 11-1 is attached falls off. When determining that the optical element 11 is damaged or falls off, the microprocessor 13 controls the power supply 2 to stop supplying power to the laser 12, and therefore the laser 12 is turned off, to effectively avoid injuries to a human eye caused by laser light emitted by the laser 12. In addition, in this solution, only one optical element 11 and detection line 11-1 need to be disposed (that is, only one conductive layer is required). Therefore, a structure is simple, a manufacturing process is simple, and costs are relatively low.

It should be noted that when the optical element 11 is damaged or falls off, the detection line 11-1 is broken, or the joint between the detection line 11-1 and the conducting wire 15 is disconnected. Therefore, in this case, the resistance value that is of the detection line 11-1 and that is monitored by the microprocessor 13 becomes extremely large or even infinite (∞), or the voltage value at the two ends of the detection line 11-1 is close to or equal to a voltage value provided by the microprocessor 13 for the entire monitoring circuit. The "specified resistance threshold range" mentioned above may be set to a numerical range that fluctuates up and down around the resistance value R when the detection line 11-1 is not broken. For example, the "specified resistance threshold range" may be set to be greater than or equal to 80% R and less than or equal to 120% R. For example, if the resistance value R obtained when the detection line 11-1 is not broken is 10 kilohms, the "specified resistance threshold range" may be set to be greater than or equal to 8 kilohms and less than or equal to 12 kilohms. The "specified voltage threshold range" mentioned above may be set to a numerical range that fluctuates up and down around the voltage value U obtained in the entire monitoring circuit when the detection line 11-1 is not broken. For example, the "specified voltage threshold range" may be set to be greater than or equal to 80% U and less than or equal to 120% U. For example, if the voltage value U obtained in the entire monitoring circuit when the detection line 11-1 is not broken is 0.8 V, the "specified voltage threshold range" may be set to be greater than or equal to 0.64 V and less than or equal to 0.96 V.

Based on the foregoing technical solutions provided in the embodiments of the present invention, in some embodiments, a material of the detection line 11-1 may be a transparent conductive material, for example, ITO, IZO (indium zinc oxide), IGZO (indium gallium zinc oxide), or an ITZO (indium tin zinc oxide), to avoid shielding light emitted by the laser 12. A material of the detection line 11-1 may alternatively be a metal conductive material, for example, argentum (Ag), copper (Cu), or chromium (Cr). In some embodiments, to prevent the detection line 11-1 of the metal material from shielding light, a relatively small width and a relatively small thickness of the detection line 11-1 of the metal material may be set, to reduce a shielding area of the detection line 11-1, and improve light transmittance of the optical element 11.

In some embodiments, the detection line 11-1 may cover all regions of the optical element 11 as much as possible, to ensure that damage in each region or even all the regions of the optical element 11 can be monitored, thereby improving monitoring accuracy. In a possible design, the optical element 11 is equally divided into a plurality of regions, so that coverage areas of the detection line 11-1 in the regions are within a same specified range. Further, the coverage areas of the detection line 11-1 in the regions are the same, to ensure that damage in all the regions of the optical element 11 can be monitored. It may be assumed that a quantity of regions into which the optical element 11 is divided is increased, and the detection line 11-1 is arranged according to the foregoing arrangement principle of the detection line 11-1, so that monitoring accuracy and sensitivity can be further improved.

Figure 6:
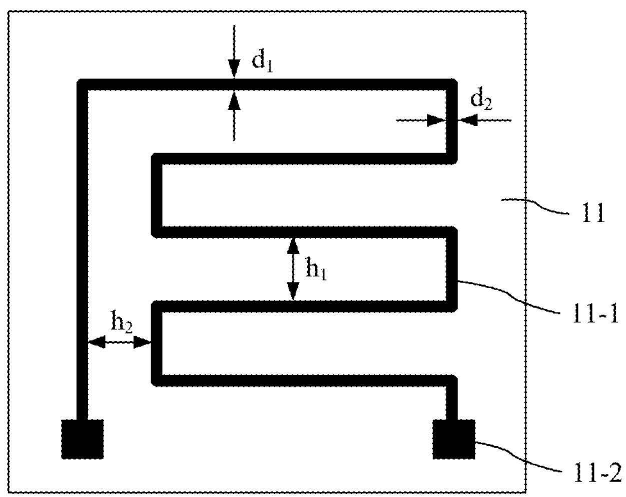
FIG. 6 is a first schematic diagram of a detection line in an optical element monitoring system according to an embodiment of the present invention.

In some embodiments, widths of the detection line 11-1 in different regions of the optical element 11 may be the same or different. Further, widths of the detection line 11-1 in different regions of the optical element 11 are the same. For example, as shown in FIG. 6, widths $d_1$ and $d_2$ of the detection line 11-1 in different regions of the optical element 11 are the same. In addition, gaps between adjacent parts of the detection line 11-1 may be the same or different. Further, gaps between adjacent parts of the detection line 11-1 are the same. For example, as shown in FIG. 6, gaps $h_1$ and $h_2$ between adjacent parts of the detection line 11-1 are the same. The widths of the detection line 11-1 in the different regions of the optical element 11 are the same, and the gaps between the adjacent parts of the detection line 11-1 are the same, so that the detection line 11-1 can have a same width and same arrangement density in all the regions of the optical element 11, to further improve monitoring accuracy and sensitivity.

A width of the detection line 11-1 should not be excessively large. Otherwise, when the optical element 11 is partially damaged, the detection line 11-1 at a corresponding location may not be broken, or only a part of the detection line 11-1 is broken and a part of the detection line 11-1 still remains connected. Consequently, a significant change in a resistance value of the detection line 11-1 cannot be monitored, thereby affecting monitoring accuracy. The width of the detection line 11-1 should not be excessively small. Otherwise, the detection line 11-1 is easily broken, and a case in which the detection line 11-1 is broken due to a factor other than damage and fall-off of the optical element 11, for example, electrostatic breakdown, may occur, thereby causing mistaken determining of damage or fall-off of the optical element 11.

In some embodiments, a value of the width of the detection line 11-1 ranges from 1 μm to 500 μm (including 1 μm and 500 μm), for example, ranges from 30 μm to 100 μm (including 30 μm and 100 μm).

A gap between adjacent parts of the detection line 11-1 should not be excessively large. Otherwise, when the optical element 11 is partially damaged, a corresponding location may not be covered by the detection line 11-1. Consequently, the damage cannot be monitored, thereby affecting monitoring sensitivity. The gap between the adjacent parts of the detection line 11-1 should not be excessively small. Otherwise, when the detection line 11-1 is formed through etching, a conductive detection line material easily remains between the adjacent parts of the detection line 11-1. Consequently, the adjacent parts of the detection line 11-1 are connected, thereby affecting monitoring sensitivity.

In some embodiments, a value of the gap between the adjacent parts of the detection line 11-1 ranges from 1 μm to 500 μm (including 1 μm and 500 μm), for example, ranges from 30 μm to 100 μm (including 30 μm and 100 μm).

Figure 7A:
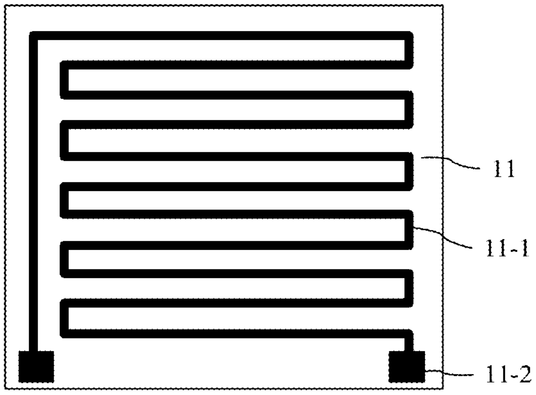
FIG. 7A to FIG. 7C are three pattern design diagrams of a detection line in an optical element monitoring system according to an embodiment of the present invention.
Figure 7B:
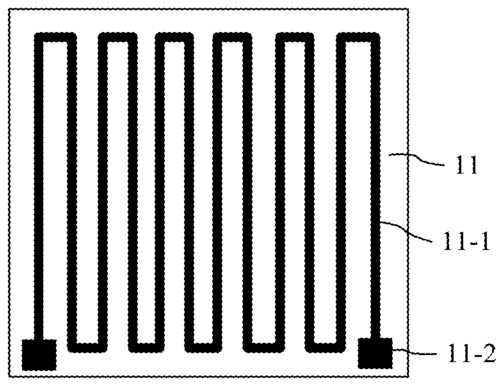
Figure 7C:
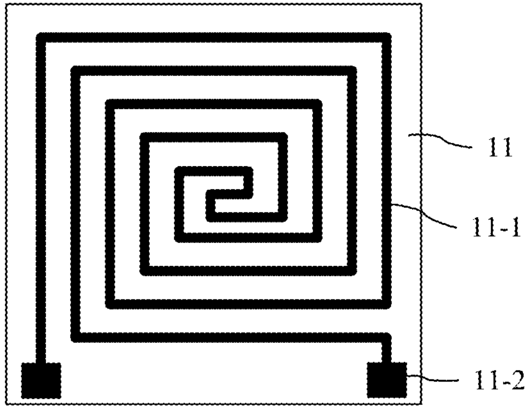

A specific pattern of the detection line 11-1 is not limited in the embodiments of the present invention. The following provides several specific pattern designs of the detection line 11-1. (1) As shown in FIG. 7A and FIG. 7B, a main body part of the detection line 11-1 is designed in a fold line shape. (2) As shown in FIG. 7C, a main body part of the detection line 11-1 is designed in a spiral line shape. In addition, a line shape of the detection line 11-1 is not limited to a straight line shape, and may be further designed as a continuous line shape such as a wave line shape or a broken line shape.

In a possible design, referring to FIG. 5A, FIG. 5B, FIG. 6, and FIG. 7A to FIG. 7C, there may be only one detection line 11-1. In this design, the resistance value monitored by the microprocessor 13 is an overall resistance of the detection line 11-1, or the voltage value monitored by the microprocessor 13 is a voltage at two ends of the detection line 11-1. When the optical element 11 is damaged or falls off, the detection line 11-1 is broken, or the joint between the detection line 11-1 and the conducting wire 15 is disconnected. Therefore, the microprocessor 13 can monitor that the resistance value becomes infinite, or the voltage value becomes close to or equal to the voltage value provided by the microprocessor 13 for the entire monitoring circuit, to determine that the optical element 11 is damaged or falls off.

Figure 8:
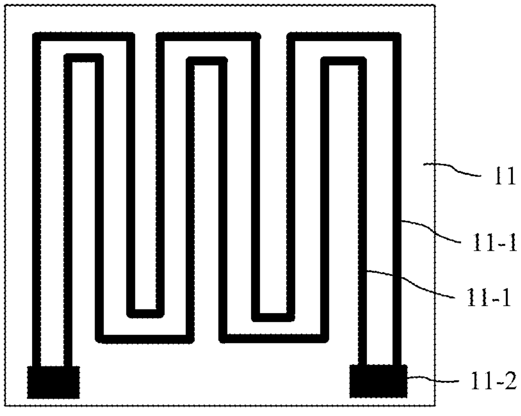
FIG. 8 is a second schematic diagram of a detection line in an optical element monitoring system according to an embodiment of the present invention.

In another possible design, referring to FIG. 8, there may be a plurality of detection lines 11-1, for example, two or more detection lines 11-1. Two ends of each detection line 11-1 are connected to the microprocessor 13, so that the plurality of detection lines 11-1 are in a parallel connection relationship. In this design, a resistance value monitored by the microprocessor 13 is a parallel resistance value obtained after the plurality of detection lines 11-1 are connected in parallel, or a voltage value monitored by the microprocessor 13 is a divided voltage value of a parallel resistance obtained after the plurality of detection lines 11-1 are connected in parallel in an entire monitoring circuit. When the optical element 11 is damaged, one or more of the detection lines 11-1 are broken. Consequently, the parallel resistance becomes larger, and the microprocessor 13 monitors that the resistance value becomes larger or the voltage value becomes larger, to determine that the optical element 11 is damaged. When the optical element 11 falls off, the entire monitoring circuit is open-circuited. Therefore, the microprocessor 13 can monitor that the resistance value becomes infinite, or the voltage value becomes close to or equal to a voltage value provided by the microprocessor 13 for the entire monitoring circuit, to determine that the optical element 11 falls off.

For a location at which the detection line 11-1 is disposed, refer to FIG. 5A again. In a possible design, the detection line 11-1 may be disposed on a surface on a side that is of the optical element 11 and that is opposite to the laser 12, so that the detection line 11-1 is electrically connected to the conducting wire 15. Certainly, the detection line 11-1 may alternatively be disposed on a surface on a side that is of the optical element 11 and that faces the laser 12. This is not limited in the embodiments of the present invention.

In some embodiments, the detection line 11-1 may be prepared by using a photoetching process. A specific process may include: A film made of a detection line material (for example, ITO, IZO, or IGZO) is first formed on a substrate of the optical element 11 by using the detection line material. The film made of the detection line material may be formed by using a process such as CVD (Chemical Vapor Deposition, chemical vapor deposition), sputtering, coating, or printing. Then, the formed film is coated with a photoresist layer, and a mask having a pattern of the detection line 11-1 is used to expose and develop the photoresist layer, to form the photoresist layer having the pattern of the detection line 11-1. Subsequently, the photoresist layer having the pattern of the detection line 11-1 is used as the mask to etch the film made of the detection line material, to form the detection line 11-1 having a specified pattern. The film made of the detection line material may be etched by using a process such as dry etching or laser etching.

In some other embodiments, the detection line 11-1 may be prepared by using a magnetron sputtering process. A specific process may include: A mask having a pattern of the detection line 11-1 is used to shield a substrate of the optical element 11, and a detection line material is sputtered on the substrate of the optical element 11, to form a detection line 11-1 having a specified pattern.

In still some other embodiments, the detection line 11-1 may be prepared by using a screen printing process. Printing is directly performed on a substrate of the optical element 11 to form the detection line 11-1 having a specified pattern.

Refer to FIG. 5A, FIG. 6, and FIG. 7A to FIG. 7C again. Conductive pads (PAD) 11-2 may be respectively disposed at two ends of the detection line 11-1, and each of the two ends of the detection line 11-1 is electrically connected to a corresponding conducting wire 15 by using a corresponding conductive pad 11-2, so that the detection line 11-1 is electrically connected to the conducting wire 15.

Optionally, the two conductive pads 11-2 may be respectively disposed at locations of edges or corners of the optical element 11. Further, the two conductive pads 11-2 may be disposed at locations of two corners on a same side of the optical element 11, to facilitate connection to the conducting wire 15.

In some embodiments, a material of the conductive pad 11-2 is the same as the material of the detection line 11-1, so that the conductive pad 11-2 and the detection line 11-1 are formed simultaneously in a same step, thereby simplifying a preparation step.

In addition, in a possible design, a width of the conductive pad 11-2 is greater than a width of the detection line 11-1, so that the detection line 11-1 is electrically connected to the conducting wire 15.

Figure 9A:
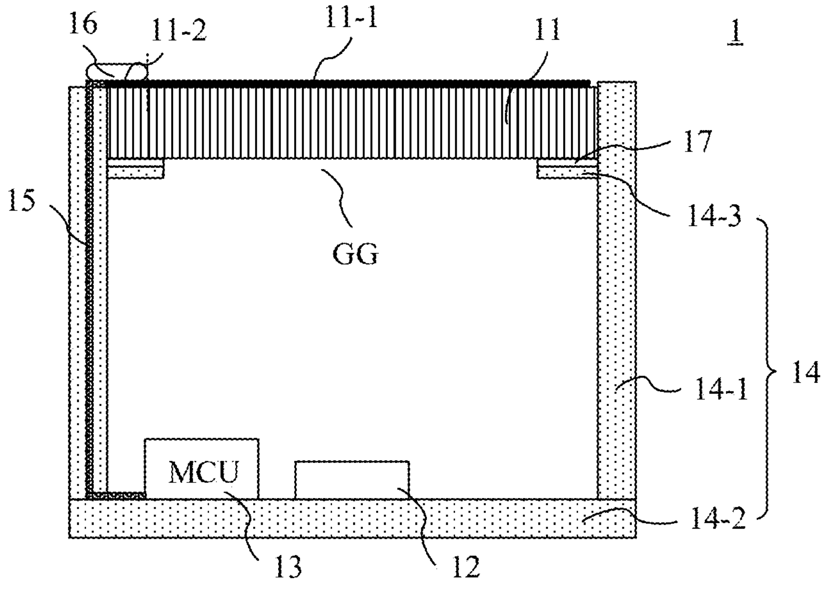
FIG. 9A to FIG. 9C are three schematic structural diagrams of an active light emitting module according to an embodiment of the present invention.

For a manner of disposing the conducting wire 15, as shown in FIG. 9A, in some embodiments, the conducting wire 15 extends inside the side wall 14-1 of the module housing 14 of the active light emitting module 1. One end of the conducting wire 15 extends to the optical element 11, and is connected to the detection line 11-1 (one end of the conducting wire 15 may be connected to the detection line 11-1 by using the conductive pad 11-2), and the other end of the conducting wire 15 extends to the bottom substrate 14-2 of the module housing 14, and is connected to the microprocessor 13. The conducting wire 15 is disposed inside the side wall 14-1, so that in addition to connecting the detection line 11-1 to the microprocessor 13, the conducting wire 15 can be prevented from being eroded by factors such as water vapor and oxygen in an external environment, thereby protecting the conducting wire 15.

In the foregoing design shown in FIG. 9A, the conducting wire 15 and the module housing 14 may be formed integrally by using an in-mold insert molding (Insert Molding) technology. Alternatively, a channel may be formed on the side wall 14-1 of the module housing 14, and then a solution of a conducting wire material is injected into the channel to form the conducting wire 15.

Figure 9B:
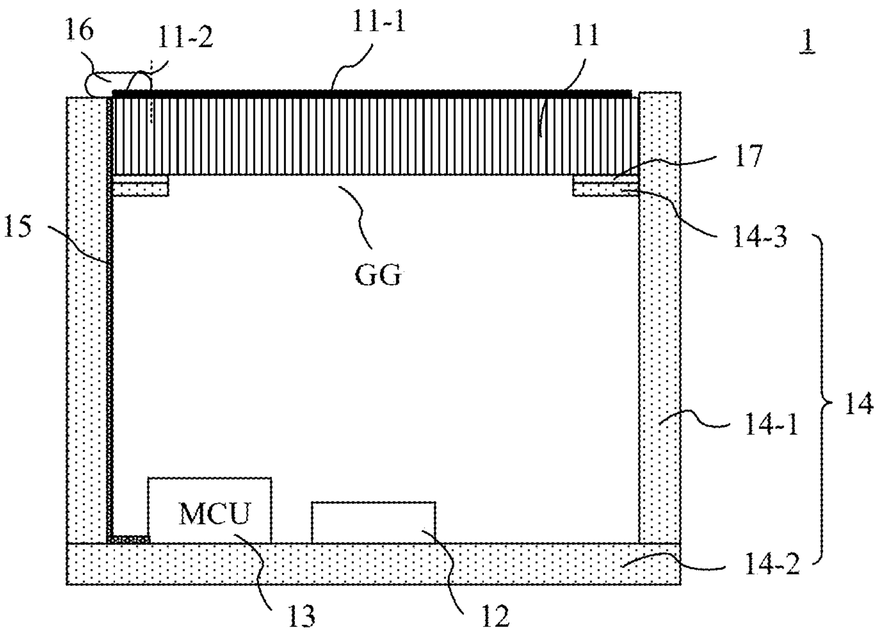

As shown in FIG. 9B, in some other embodiments, the conducting wire 15 extends on an inner surface of the side wall 14-1 of the module housing 14 of the active light emitting module 1. One end of the conducting wire 15 extends to the optical element 11, and is connected to the detection line 11-1 (one end of the conducting wire 15 may be connected to the detection line 11-1 by using the conductive pad 11-2), and the other end of the conducting wire 15 extends to the bottom substrate 14-2 of the module housing 14, and is connected to the microprocessor 13.

Figure 9C:
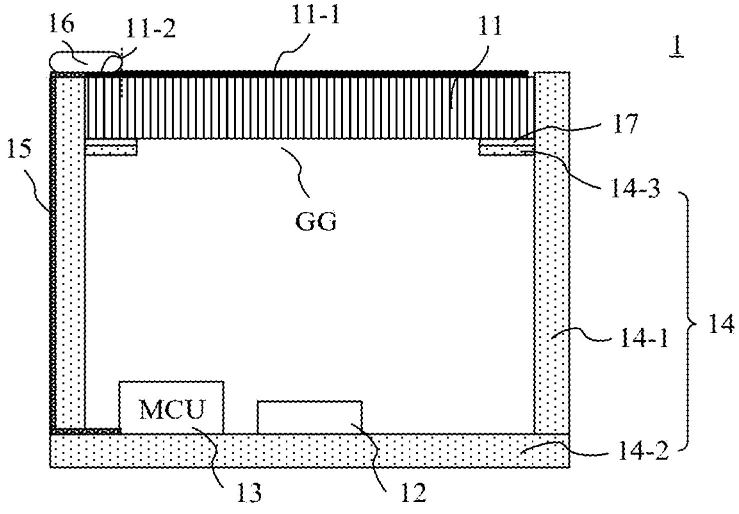

As shown in FIG. 9C, in still some other embodiments, the conducting wire 15 extends on an outer surface of the side wall 14-1 of the module housing 14 of the active light emitting module 1. One end of the conducting wire 15 extends to the optical element 11, and is connected to the detection line 11-1 (one end of the conducting wire 15 may be connected to the detection line 11-1 by using the conductive pad 11-2), and the other end of the conducting wire 15 extends to the bottom substrate 14-2 of the module housing 14, and is connected to the microprocessor 13.

In the foregoing designs shown in FIG. 9B and FIG. 9C, the conducting wire 15 may be formed on the inner surface or the outer surface of the side wall 14-1 of the module housing 14 through coating, printing, pasting, or the like.

In addition, in the foregoing designs shown in FIG. 9B and FIG. 9C, further, a protective layer may be formed on the conductive wire 15 to cover the conductive wire 15, so as to avoid a problem that the conductive wire 15 is eroded due to exposure. A material of the protective layer may be an organic or inorganic material that has water and oxygen isolation and erosion resistance performance.

A material of the conducting wire 15 may be a material having conductive performance, for example, a metal conductive material such as argentum (Ag), copper (Cu), or chromium (Cr), a semiconductor conductive material, or an oxide conductive material.

For a manner of connecting the detection line 11-1 to the conducting wire 15, a conductive electrode may be attached to a joint between the detection line 11-1 and the conducting wire 15, so that the detection line 11-1 is connected to the conducting wire 15. Further, refer to FIG. 9A to FIG. 9, for a structure in which the detection line 11-1 is connected to the conducting wire 15 by using the conductive pad 11-2, a conductive electrode 16 may be attached to a joint between the conductive pad 11-2 and the conducting wire 15, so that the conductive pad 11-2 is connected to the conducting wire 15, and therefore the detection line 11-1 is connected to the conducting wire 15.

In some embodiments, a material of the conductive electrode 16 may be a conductive adhesive, and further, may be a conductive silver adhesive. During preparation, the conductive adhesive is dispensed at a joint between the detection line 11-1 and the conducting wire 15 or a joint between the conductive pad 11-2 and the conducting wire 15 through adhesive dispensing. The material of the conductive electrode 16 may alternatively be soldering tin. During preparation, soldering iron may be used to solder the soldering tin to a joint between the detection line 11-1 and the conducting wire 15 or a joint between the conductive pad 11-2 and the conducting wire 15.

Figure 10:
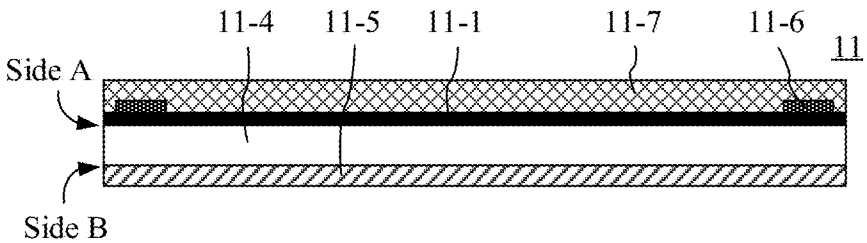
FIG. 10 is a schematic cross-sectional structural diagram of an optical element according to an embodiment of the present invention.
Figure 11A:
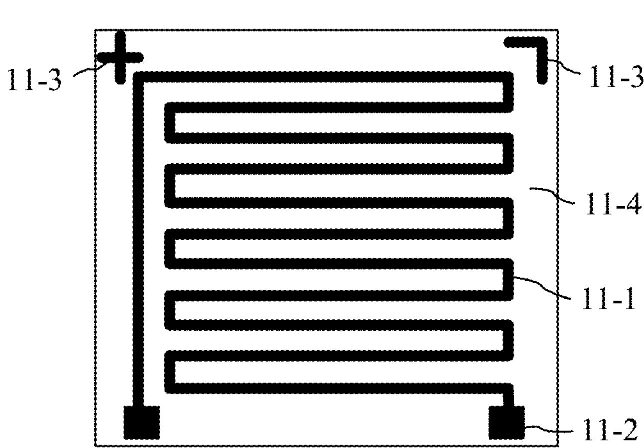
FIG. 11A to FIG. 11D are schematic structural top views of film layers in an optical element according to an embodiment of the present invention.

Based on the foregoing descriptions of the optical element monitoring system provided in the embodiments of the present invention, an embodiment of the present invention further provides an optical element 11. As shown in FIG. 10 and FIG. 11A, the optical element 11 includes a substrate 11-4, and a detection line 11-1 disposed on a surface on one side of the substrate 11-4.

For designs of a function of the detection line 11-1, a connection relationship with another component, a material, a width, a gap between adjacent parts, a specific pattern, an arrangement quantity, a disposition location, a preparation process, and the like, refer to the descriptions of the detection line 11-1 in the optical element monitoring system provided in the embodiments of the present invention. Details are not described herein again.

In a possible design, the optical element 11 further includes a conductive pad 11-2. The conductive pad 11-2 and the detection line 11-1 are disposed at a same layer. For designs of a function of the conductive pad 11-2, a connection relationship with another component, a material, an arrangement quantity, a disposition location, a preparation process, and the like, refer to the descriptions of the conductive pad 11-2 in the optical element monitoring system provided in the embodiments of the present invention. Details are not described herein again.

Optionally, the optical element 11 further includes a first alignment mark 11-3. The first alignment mark 11-3 is disposed at a same layer as the detection line 11-1 and the conductive pad 11-2. When the optical element 11 is assembled into the active light emitting module, the first alignment mark 11-3 is configured to mark a location of the optical element 11, so as to precisely determine the location of the optical element 11 in the active light emitting module. A material of the first alignment mark 11-3 may be the same as a material of the detection line 11-1 and a material of the conductive pad 11-2, so that the first alignment mark 11-3, the detection line 11-1, and the conductive pad 11-2 can be formed in a same step, thereby simplifying a preparation process. For example, there are two first alignment marks 11-3, which are respectively located at locations of two corners on a same side of the rectangular substrate 11-4, for example, respectively located at an upper left corner and an upper right corner of the rectangular substrate 11-4.

Figure 11B:
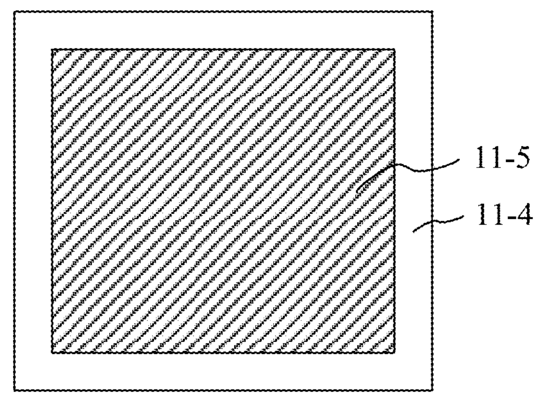

As shown in FIG. 10 and FIG. 11B, in some embodiments, the optical element 11 further includes a microstructure layer 11-5. The microstructure layer 11-5 is disposed on the other side that is of the substrate 11-4 and that is opposite to a side on which the detection line 11-1 is located. To be specific, the substrate 11-4 includes a side A and a side B that are opposite to each other, the detection line 11-1 is disposed on a surface on the side A of the substrate 11-4, and the microstructure layer 11-5 is disposed on a surface on the side B of the substrate 11-4.

In a possible design, the microstructure layer 11-5 is disposed on the surface on the side A of the substrate 11-4, and the detection line 11-1 is disposed on the surface on the side B of the substrate 11-4. Certainly, the microstructure layer 11-5 and the detection line 11-1 may alternatively be disposed on a surface on a same side of the substrate 11-4, for example, the surface on the side A or the surface on the side B. If the microstructure layer 11-5 and the detection line 11-1 are disposed on the surface on the same side of the substrate 11-4, the detection line 11-1 may be disposed on a side that is of the microstructure layer 11-5 and that is opposite to the substrate 11-4, or the detection line 11-1 may be disposed between the microstructure layer 11-5 and the substrate 11-4.

Microstructure layers 11-5 of different types of optical elements 11 include different microstructures. For example, if the optical element 11 is a diffractive optical element, a microstructure included in the microstructure layer 11-5 is a diffraction grating microstructure. If the optical element 11 is a diffuser, a microstructure included in the microstructure layer 11-5 is a diffusion microstructure such as a dot.

In a possible design, referring to FIG. 11B and FIG. 9A to FIG. 9C, when the optical element 11 is mounted in the active light emitting module, an edge of the optical element 11 is fastened to a surface that is of the support structure 14-3 of the module housing 14 and that is opposite to the laser 12 by using the adhesive 17. The microstructure layer 11-5 of the optical element 11 is located on a surface that is of the substrate 11-4 and that faces the laser 12, and an area of orthographic projection of the microstructure layer 11-5 on the substrate 11-4 is less than an area of the substrate 11-4, to reserve an edge region on the surface that is of the substrate 11-4 and that faces the laser 12. In this way, the adhesive 17 is directly bonded to the surface that is of the substrate 11-4 and that faces the laser 12 and the surface that is of the support structure 14-3 and that is opposite to the laser 12, to avoid contact with the microstructure layer 11-5, so that the optical element 11 is more firmly bonded to the support structure 14-3.

Figure 11C:
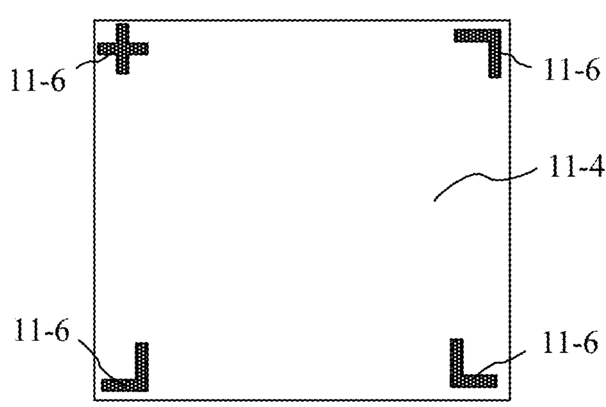

As shown in FIG. 10 and FIG. 11C, in some embodiments, the optical element 11 further includes a second alignment mark 11-6. The second alignment mark 11-6 is disposed on a side that is of the substrate 11-4 and on which the detection line 11-1 is located, and the second alignment mark 11-6 is formed after the detection line 11-1 is formed. To be specific, both the second alignment mark 11-6 and the detection line 11-1 are disposed on the side A or the side B of the substrate 11-4, and the second alignment mark 11-6 is formed after the detection line 11-1 is formed. When the optical element 11 is assembled into the active light emitting module, the second alignment mark 11-6 is configured to mark a location of the optical element 11, so as to precisely determine the location of the optical element 11 in the active light emitting module.

It should be noted that the foregoing description is merely an example for describing a location at which the second alignment mark 11-6 is disposed at each film layer of the optical element 11, and the location at which the second alignment mark 11-6 is disposed at each film layer of the optical element 11 is not limited in this embodiment of the present invention. The second alignment mark 11-6 may be disposed at any location at each film layer of the optical element 11, provided that the second alignment mark 11-6 can mark the location of the optical element 11. For example, the second alignment mark 11-6 is disposed between the detection line 11-1 and the substrate 11-4. Alternatively, the second alignment mark 11-6 is disposed between the microstructure layer 11-5 and the substrate 11-4. Alternatively, the second alignment mark 11-6 is disposed on a side that is of the microstructure layer 11-5 and that is opposite to the substrate 11-4.

A quantity of second alignment marks 11-6 is not limited in this embodiment of the present invention. In addition, the second alignment mark 11-6 may be disposed at a location of an edge or a corner of the optical element 11. To be specific, orthographic projection of the second alignment mark 11-6 on the substrate 11-4 may be located at a location of an edge or a corner of the substrate 11-4. For example, for the rectangular optical element 11, a second alignment mark 11-6 may be disposed at each of locations of four corners of the optical element 11.

In some other possible designs, if both the first alignment mark 11-3 and the second alignment mark 11-6 are disposed in the optical element 11, orthographic projection of the first alignment mark 11-3 and the second alignment mark 11-6 at a same location of the optical element 11 overlaps on the substrate 11-4. For example, if both the first alignment mark 11-3 and the second alignment mark 11-6 are disposed in the upper left corner (or the upper right corner, or the lower left corner, or the lower right corner) of the rectangular optical element 11, orthographic projection of the first alignment mark 11-3 and the second alignment mark 11-6 in the upper left corner (or the upper right corner, or the lower left corner, or the lower right corner) overlaps on the substrate 11-4.

A material of the second alignment mark 11-6 may be a material with relatively low transmittance, such as a metal, so that the second alignment mark 11-6 can be more clearly observed when the optical element 11 is assembled into the active light emitting module.

Figure 11D:
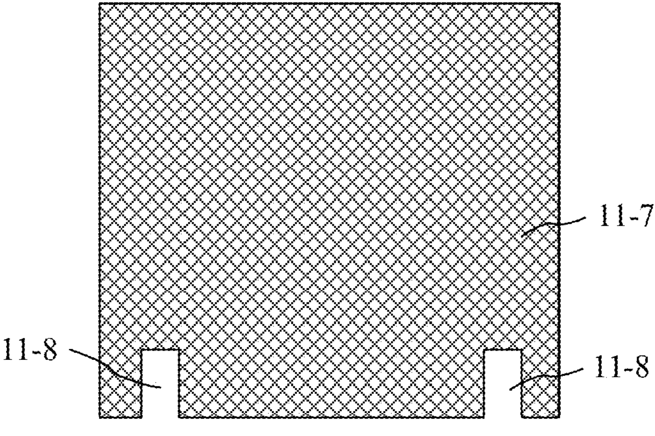

As shown in FIG. 10 and FIG. 11D, in some embodiments, the optical element 11 further includes a protective layer 11-7. The protective layer 11-7 is disposed on a side that is of the substrate 11-4 and on which the detection line 11-1 is located. To be specific, both the protective layer 11-7 and the detection line 11-1 are disposed on the side A or the side B of the substrate 11-4. In addition, the protective layer 11-7 covers the detection line 11-1. The protective layer 11-7 covers the detection line 11-1 to protect the detection line 11-1. A material of the protective layer 11-7 may be an organic or inorganic material that has water and oxygen isolation and erosion resistance performance.

It should be noted that in a possible design, referring to FIG. 10, if both the detection line 11-1 and the second alignment mark 11-6 are disposed on the side A or the side B of the substrate 11-4, and the second alignment mark 11-6 is formed by using a material that is easily oxidized and eroded, such as a metal, the protective layer 11-7 may cover the detection line 11-1 and the second alignment mark 11-6, to protect the detection line 11-1 and the second alignment mark 11-6.

In a possible design, an opening 11-8 is disposed at the protective layer 11-7, to expose an end part of the detection line 11-1 or the conductive pad 11-2, so as to facilitate an electrical connection between the end part of the detection line 11-1 or the conductive pad 11-2 and the conducting wire 15. A location at which the opening 11-8 is disposed is determined based on a location of the end part of the detection line 11-1 or the conductive pad 11-2.

Based on the foregoing descriptions of the optical element monitoring system and the optical element provided in the embodiments of the present invention, an embodiment of the present invention further provides an active light emitting module 1. As shown in FIG. 9A to FIG. 9C, the active light emitting module 1 includes an optical element 11, a conducting wire 15, a laser 12, a microprocessor 13, and a module housing 14. The module housing 14 includes at least a bottom substrate 14-2 and a side wall 14-1. The optical element 11 is mounted at one end that is of the side wall 14-1 and that is away from the bottom substrate 14-2. The module housing 14 further includes a support structure 14-3. Referring to FIG. 4B, the support structure 14-3 is in a ring structure, and is disposed around an inner surface of the side wall 14-1, to form an aperture GG. An edge of the optical element 11 is fastened to a surface that is of the support structure 14-3 and that is opposite to the laser 12 by using an adhesive 17. The laser 12 and the microprocessor 13 are mounted on the bottom substrate 14-2, and are connected to each other. The microprocessor 13 controls the laser 12 to emit laser light. The laser light is emitted out of the active light emitting module 1 by using the optical element 11 through the aperture GG.

The optical element 11 includes a detection line 11-1. Two ends of the detection line 11-1 are connected to the microprocessor 13 by using conducting wires 15. The microprocessor 13 monitors a resistance value of the detection line 11-1 or a voltage value at the two ends of the detection line 11-1 in real time. When the resistance value of the detection line 11-1 exceeds a specified resistance threshold range, or when the voltage value at the two ends of the detection line 11-1 exceeds a specified voltage threshold range, it is determined that the optical element 11 is damaged or falls off. In this case, the microprocessor 13 controls a power supply 2 to stop supplying power to the laser 12, and therefore the laser 12 is turned off, to effectively avoid injuries to a human eye caused by laser light emitted by the laser 12. In addition, only one optical element 11 and detection line 11-1 need to be disposed on the active light emitting module 1 (that is, only one conductive layer is required). Therefore, a structure is simple, a manufacturing process is simple, and costs are relatively low.

In the active light emitting module 1, for a manner of connecting the detection line 11-1 to the conducting wire 15, and a manner of disposing the conducting wire 15 on the side wall 14-1 of the module housing 14, refer to the descriptions of the conducting wire 15 in the optical element monitoring element provided in the embodiments of the present invention. Details are not described herein again.

It should be noted that the active light emitting module 1 provided in this embodiment of the present invention is any module that can emit laser light, for example, the module that is in the ToF 3D sensing module and that includes the high-power laser, or the dot-matrix projector 115-5 and the flood illuminator 115-2 that are in the structured light 3D sensing module 115.

Based on the foregoing descriptions of the active light emitting module 1 provided in this embodiment of the present invention, an embodiment of the present invention further provides a terminal. The terminal includes the active light emitting module 1 provided in this embodiment of the present invention, configured to provide specified laser light (for example, if the active light emitting module 1 is the dot-matrix projector 115-5, the specified light that needs to be provided by the active light emitting module 1 is structured light), to assist the terminal in implementing a 3D sensing function. When the active light emitting module 1 is mounted in the terminal such as the mobile phone 100, a side (namely, a light emitting side) of the laser 12 in the active light emitting module 1 is close to the inside of the terminal, and a side (namely, a light outgoing side) of the optical element 11 faces the outside of the terminal, to project the specified laser light outward.

Figures 12, 13:
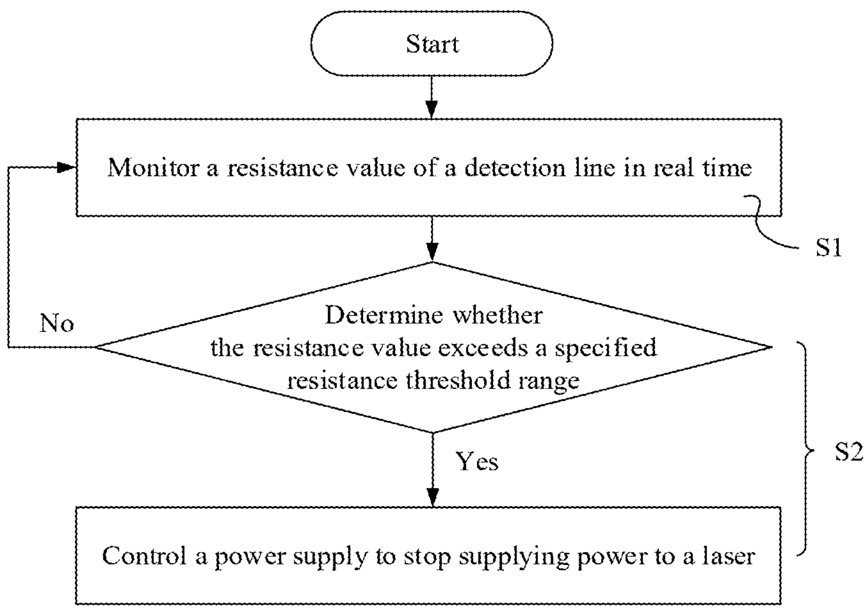
FIG. 12 is a first flowchart of an optical element monitoring method according to an embodiment of the present invention.
FIG. 13 is a second flowchart of an optical element monitoring method according to an embodiment of the present invention.

Based on the foregoing descriptions of the optical element monitoring system provided in the embodiments of the present invention, an embodiment of the present invention further provides an optical element monitoring method. The optical element monitoring method is applied to the optical element monitoring system provided in the embodiments of the present invention. As shown in FIG. 12, referring to FIG. 5A and FIG. 5B again, the optical element monitoring method includes the following steps.

S1: A microprocessor 13 monitors a resistance value of the detection line 11-1 in real time.

In a possible implementation, as shown in FIG. 13, step S1 may specifically include the following steps.

S11: The microprocessor 13 monitors a voltage value at two ends of the detection line 11-1 in real time. In this step, if the optical element 11 is not damaged or falls off, the monitored voltage value is close to or equal to a voltage value obtained in an entire monitoring circuit (namely, the monitoring circuit including the detection line 11-1, the conducting wire 15, and the microprocessor 13) when the detection line 11-1 is not broken. If the optical element 11 is damaged or falls off, and a monitoring circuit is open-circuited, the monitored voltage value is close to or equal to a voltage value provided by the microprocessor 13 for the entire monitoring circuit.

It should be noted that the microprocessor 13 monitors the voltage value at the two ends of the detection line 11-1 by applying a voltage to the detection line 11-1. Specifically, the microprocessor 13 provides a specific voltage for the entire monitoring circuit, and the detection line 11-1 in the monitoring circuit obtains a part from the voltage, so that the microprocessor 13 applies the voltage to the detection line 11-1. The voltage provided by the microprocessor 13 for the entire monitoring circuit may be a continuous voltage signal, or may be a discontinuous voltage signal, for example, a voltage signal in a pulse mode, to reduce power consumption and reduce erosion caused by the voltage signal to the detection line 11-1. The voltage provided by the microprocessor 13 for the entire monitoring circuit is supplied by a power supply (for example, the power apparatus 111 of the mobile phone 100) of the terminal. For example, the voltage value provided by the microprocessor 13 for the entire monitoring circuit is 2.85 V, and a resistance value obtained when the detection line 11-1 is not broken is 10 kilohms. When the entire monitoring circuit is not open-circuited, the detection line 11-1 obtains a voltage of 0.8 V, in other words, the voltage value at the two ends of the detection line 11-1 is 0.8 V.

S12: The microprocessor 13 converts the monitored voltage value into the resistance value.

In this step, the microprocessor 13 converts the real-time monitored voltage value into the resistance value. If the monitored voltage value is close to or equal to the voltage value obtained in the entire monitoring circuit when the detection line 11-1 is not broken, the resistance value obtained through conversion needs to be close to or equal to the resistance value obtained when the detection line 11-1 is not broken. If the monitored voltage value is close to or equal to the voltage value provided by the microprocessor 13 for the entire monitoring circuit, the resistance value obtained through conversion is infinite.

S2: The microprocessor 13 determines whether the monitored resistance value exceeds a specified resistance threshold range, and if the monitored resistance value exceeds the specified resistance threshold range, the microprocessor 13 controls the power supply 2 to stop supplying power to the laser 12; or if the monitored resistance value does not exceed the specified resistance threshold range, the microprocessor 13 returns to step S1.

In step S2, the specified resistance threshold range may be set to a numerical range that fluctuates up and down around the resistance value R when the detection line 11-1 is not broken. For example, the specified resistance threshold range may be set to be greater than or equal to 80% R and less than or equal to 120% R. If the resistance value obtained in step S1 exceeds the specified resistance threshold range, it indicates that the monitoring circuit is open-circuited, that is, the detection line 11-1 may be broken, or a joint between the detection line 11-1 and the conducting wire 15 may be disconnected. This indicates that the optical element 11 is damaged or falls off. In this case, the microprocessor 13 sends an interrupt signal to the power supply 2, and controls the power supply 2 to stop supplying power to the laser 12, and therefore the laser 12 is turned off, to avoid a problem that a human eye is damaged because laser light is directed onto the human eye when the optical element 11 is damaged or falls off. If the resistance value obtained in step S1 does not exceed the specified resistance threshold range, it indicates that the monitoring circuit works normally, the optical element 11 is normal, the power supply 2 may continue to supply power to the laser 12, and the microprocessor 13 may return to step S1 to monitor a resistance value of the detection line 11-1 at a next moment.

For example, if the resistance value obtained when the detection line 11-1 is not broken is 10 kilohms, the specified resistance threshold range is set to be greater than or equal to 8 kilohms and less than or equal to 12 kilohms. The voltage value provided by the microprocessor 13 for the entire monitoring circuit is 2.85 V. When the entire monitoring circuit is not open-circuited, the detection line 11-1 obtains a voltage of 0.8 V.

At a moment t1, the microprocessor 13 monitors that a voltage value U at the two ends of the detection line 11-1 is 2.85 V, obtains, according to a resistance voltage division principle, an infinite resistance value R by converting the voltage value U, and determines that the resistance value R obtained through conversion already exceeds the specified resistance threshold range of 8 kilohms to 12 kilohms. In this case, the microprocessor 13 determines that the optical element 11 is damaged or falls off, and controls the power supply 2 to stop supplying power to the laser 12.

At a moment t2, the microprocessor 13 monitors that a voltage value U at the two ends of the detection line 11-1 is 0.8 V, obtains, according to a resistance voltage division principle, a resistance value 10 kilohms by converting the voltage value U, and determines that the resistance value R obtained through conversion is within the specified resistance threshold range of 8 kilohms to 12 kilohms. In this case, the microprocessor 13 determines that the optical element 11 is normal, and the power supply 2 may continue to supply power to the laser 12.

Figure 14:
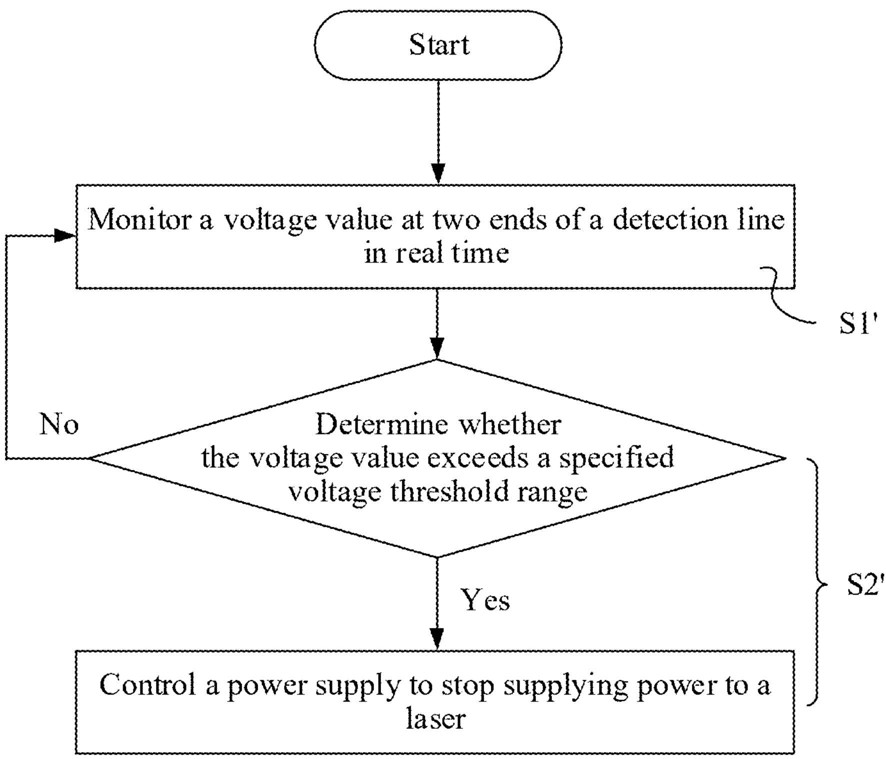
FIG. 14 is a third flowchart of an optical element monitoring method according to an embodiment of the present invention.

In some embodiments, the microprocessor 13 may further determine, by monitoring the voltage value at the two ends of the detection line 11-1 in real time, whether the monitored voltage value exceeds a specified voltage threshold range, to determine whether the optical element 11 is damaged or falls off. As shown in FIG. 14, referring to FIG. 5A and FIG. 5B again, the optical element monitoring method includes the following steps.

S1': The microprocessor 13 monitors a voltage value at two ends of the detection line 11-1 in real time.

For detailed descriptions of step S1', refer to the foregoing descriptions of step S11. Details are not described herein again.

S2': The microprocessor 13 determines whether the monitored voltage value exceeds a specified voltage threshold range, and if the monitored voltage value exceeds the specified voltage threshold range, the microprocessor 13 controls the power supply 2 to stop supplying power to the laser 12; or if the monitored voltage value does not exceed the specified voltage threshold range, the microprocessor 13 returns to step S1'.

In step S2', the specified voltage threshold range may be set to a numerical range that fluctuates up and down around the voltage value U obtained in an entire monitoring circuit when the detection line 11-1 is not broken. For example, the specified voltage threshold range may be set to be greater than or equal to 80% U and less than or equal to 120% U. If the voltage value monitored in step S1' exceeds the specified voltage threshold range, it indicates that the monitoring circuit is open-circuited, that is, the detection line 11-1 may be broken, or a joint between the detection line 11-1 and the conducting wire 15 may be disconnected. This indicates that the optical element 11 is damaged or falls off. In this case, the microprocessor 13 sends an interrupt signal to the power supply 2, and controls the power supply 2 to stop supplying power to the laser 12, and therefore the laser 12 is turned off, to avoid a problem that a human eye is damaged because laser light is directed onto the human eye when the optical element 11 is damaged or falls off. If the voltage value monitored in step S1' does not exceed the specified voltage threshold, it indicates that the monitoring circuit works normally, the optical element 11 is normal, the power supply 2 may continue to supply power to the laser 12, and the microprocessor 13 may return to step S1' to monitor a voltage value at the two ends of the detection line 11-1 at a next moment.

For example, a voltage value provided by the microprocessor 13 for the entire monitoring circuit is 2.85 V. When the entire monitoring circuit is not open-circuited, the detection line 11-1 obtains a voltage of 0.8 V, and therefore the specified voltage threshold range is set to be greater than or equal to 0.64 V and less than or equal to 0.96 V.

At a moment t1', the microprocessor 13 monitors that a voltage value U at the two ends of the detection line 11-1 is 2.85 V, and the voltage value U already exceeds the specified voltage threshold range of 0.64 V to 0.96 V. In this case, the microprocessor 13 determines that the optical element 11 is damaged or falls off, and controls the power supply 2 to stop supplying power to the laser 12.

At a moment t2', the microprocessor 13 monitors that a voltage value U at the two ends of the detection line 11-1 is 0.8 V, and the voltage value U is within the specified voltage threshold range of 0.64 V to 0.96 V. In this case, the microprocessor 13 determines that the optical element 11 is normal, and the power supply 2 may continue to supply power to the laser 12.

It may be understood that to implement the foregoing functions, the terminal or the like includes corresponding hardware structures and/or software modules for performing the functions. A person skilled in the art should be easily aware that units, algorithms, and steps in the examples described with reference to the embodiments disclosed in this specification can be implemented by hardware or a combination of hardware and computer software in the embodiments of the present invention. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of the embodiments of the present invention.

The foregoing descriptions are merely specific implementations of the present invention, but are not intended to limit the protection scope of the present invention. Any variation or replacement within the technical scope disclosed in the present invention shall fall within the protection scope of the present invention. Therefore, the protection scope of the present invention shall be subject to the protection scope of the claims.

The invention claimed is:

1. An apparatus, comprising:
- a first conductive pad;
- a second conductive pad;
- a substrate comprising:
  - a diffractive element (DOR) or a diffuser; and
  - a portion directly between the first conductive pad and the second conductive pad, separating the first conductive pad and the second conductive pad, and configured to:
    - be disposed in a light emission direction of a laser; and
    - pass light from the laser;
- a detection line between the first conductive pad and the second conductive pad, disposed on the portion, configured to transmit an electrical signal, extending in a wave line shape, and comprising:
  - a transparent conductive material;
  - first adjacent portions in the light emission direction and comprising at least two parallel straight-line portions;
  - second adjacent portions in the light emission direction; and a width extending in the wave line shape and ranging from 1 micrometer (μm) to 30 μm;

a first gap in a first direction between the first adjacent portions and comprising a first size ranging from 1 μm to 30 μm, wherein the first size is the same throughout lengths of the at least two parallel straight-line portions; and a second gap in a second direction between the second adjacent portions and comprising a second size ranging from 1 μm to 30 μm, wherein the first direction and the second direction are different directions.

2. The apparatus of claim 1, wherein the transparent conductive material comprises indium tin oxide, indium zinc oxide, indium gallium zinc oxide, or indium tin zinc oxide.

3. The apparatus of claim 1, further comprising a microstructure layer, wherein the microstructure layer and the detection line are disposed either on a same side of the substrate or on opposite sides of the substrate.

4. The apparatus of claim 1, wherein the detection line further comprises an end part, wherein the first conductive pad, the second conductive pad, and the detection line are disposed on a same side of the substrate, and wherein at least one of the first conductive pad or the second conductive pad is electrically coupled to the end part.

5. The apparatus of claim 4, wherein the first conductive pad, the second conductive pad, and the detection line comprise a same material.

6. The apparatus of claim 4, further comprising a protective layer covering the detection line, wherein the protective layer comprises an opening that is disposed at the protective layer and that exposes the first conductive pad and the second conductive pad.

7. The apparatus of claim 1, wherein the first conductive pad and the second conductive pad are configured to be coupled to a processor for detecting the electrical signal.

8. The apparatus of claim 1, wherein the first gap and the second gap are the same size.

9. An apparatus, comprising:

a housing comprising:

a bottom substrate; and a side wall;

a laser mounted on the bottom substrate;

an optical element that is a component of a terminal, mounted at one end of the side wall and away from the bottom substrate, and comprising:

a first conductive pad;

a second conductive pad;

a substrate comprising:

a diffractive element (DOR) or a diffuser; and a portion directly between the first conductive pad and the second conductive pad, separating the first conductive pad and the second conductive pad, and configured to:

be disposed in a light emission direction of the laser; and pass light from the laser;

a detection line between the first conductive pad and the second conductive pad, disposed on the portion, configured to transmit an electrical signal, extending in a wave line shape, and comprising: a transparent conductive material;

two ends;

first adjacent portions in the light emission direction and comprising at least two parallel straight-line portions;

second adjacent portions in the light emission direction; and a width extending in the wave line shape and ranging from 1 micrometer (μm) to 30 μm;

a first gap in a first direction between the first adjacent portions and comprising a first size ranging from 1 μm to 30 μm, wherein the first size is the same throughout lengths of the at least two parallel straight-line portions; and a second gap in a second direction between the second adjacent portions and comprising a second size ranging from 1 μm to 30 μm, wherein the first direction and the second direction are different directions; and conducting wires configured to connect the two ends to a processor.

10. The apparatus of claim 9, wherein the side wall comprises an inner surface and an outer surface, and wherein the conducting wires are configured to extend from the two ends to the processor inside the side wall, on the inner surface, or on the outer surface.

11. The apparatus of claim 9, further comprising:

a joint between one of the two ends and one of the conducting wires; and a conductive electrode disposed at the joint and configured to electrically connect the detection line and the one of the conducting wires.

12. The apparatus of claim 11, wherein a material of the conductive electrode is conductive silver paste or soldering tin.

13. An apparatus, comprising:

a processor;

a power supply coupled to the processor;

a laser coupled to the power supply; and an optical element comprising:

a first conductive pad;

a second conductive pad;

a substrate comprising a portion that is directly between the first conductive pad and the second conductive pad, that separates the first conductive pad and the second conductive pad, and that is configured to:

be disposed in a light emission direction of the laser; and pass light from the laser;

a detection line between the first conductive pad and the second conductive pad, disposed on the portion, configured to transmit an electrical signal, extending in a wave line shape, and comprising:

a transparent conductive material;

first adjacent portions in the light emission direction and comprising at least two parallel straight-line portions;

second adjacent portions in the light emission direction; and a width extending in the wave line shape and ranging from 1 micrometer (μm) to 30 μm;

a first gap in a first direction between the first adjacent portions and comprising a first size ranging from 1 μm to 30 μm, wherein the first size is the same throughout lengths of the at least two parallel straight-line portions;

a second gap in a second direction between the second adjacent portions and comprising a second size ranging from 1 μm to 30 μm; and two ends connected to the processor.

14. The apparatus of claim 13, wherein the optical element further comprises a microstructure layer, and wherein the microstructure layer and the detection line are disposed on a same side of the substrate.

15. The apparatus of claim 13, wherein the optical element further comprises a microstructure layer, and wherein the microstructure layer and the detection line are disposed on opposite sides of the substrate.

16. The apparatus of claim 13, wherein the substrate further comprises a diffractive optical element (DOE) or a diffuser, and wherein the optical element is a component of a terminal.

17. The apparatus of claim 16, wherein the detection line is configured to detect whether the DOE or the diffuser is damaged or falls off.

18. The apparatus of claim 13, wherein the transparent conductive material comprises indium tin oxide, indium zinc oxide, indium gallium zinc oxide, or indium tin zinc oxide.

19. The apparatus of claim 13, wherein the width is the same on the portion.

* * * * *